United States Patent [19]
Salley et al.

[11] Patent Number: 5,426,371
[45] Date of Patent: * Jun. 20, 1995

[54] AUTOMATIC BATTERY AND CHARGING SYSTEM TESTER WITH MOTOR-DRIVEN CARBON PILE LOADING

[75] Inventors: Glenn E. Salley, Racine; Sohrab S. Rameshk, Milwaukee; Thomas P. Becker, Kenosha; Dennis G. Thibedeau, Franklin; Ronald D. Geisler, Kenosha; Paul A. Willems, Kenosha; Robert D. Braun, Kenosha, all of Wis.

[73] Assignee: Snap-on Incorporated, Kenosha, Wis.

[ * ] Notice: The portion of the term of this patent subsequent to Oct. 19, 2010 has been disclaimed.

[21] Appl. No.: 111,594

[22] Filed: Aug. 23, 1993

Related U.S. Application Data

[60] Division of Ser. No. 751,704, Aug. 29, 1991, Pat. No. 5,254,952, which is a continuation-in-part of Ser. No. 660,163, Feb. 25, 1991, abandoned, which is a continuation of Ser. No. 405,447, Sep. 11, 1989, abandoned.

[51] Int. Cl.⁶ .............................................. G01N 27/42
[52] U.S. Cl. ..................... 324/429; 340/636; 324/433
[58] Field of Search ............... 324/429, 426, 430, 433; 340/636; 320/48

[56] References Cited

U.S. PATENT DOCUMENTS

| | | | |
|---|---|---|---|
| 4,352,067 | 9/1982 | Ottone | 324/434 |
| 4,767,977 | 8/1988 | Fasen et al. | 320/48 |
| 4,914,383 | 4/1990 | Wilkerson | 324/117 H |
| 4,929,931 | 5/1990 | McCuen | 340/636 |
| 5,254,952 | 10/1993 | Salley et al. | 324/429 |

OTHER PUBLICATIONS

Manual 1552 Snap-On Tools.

*Primary Examiner*—Maura K. Regan
*Attorney, Agent, or Firm*—Emrich & Dithmar

[57] ABSTRACT

A battery and charging system tester includes an automatically-operated carbon pile for loading the battery, the pile having a shaft therethrough rotated by a stepper motor, and a compression nut threadedly engaged with the shaft for movement into and out of engagement with the carbon pile in response to rotation of the shaft for varying the compression of the pile and, thereby, the impedance thereof. Probes are provided for sensing battery load current and output voltage, and the output current of an alternator charging unit. A feedback control circuit including a microprocessor operating under stored program control converts the analog probe outputs to digital signals and compares the battery output voltage and load current to selectively variable references for controlling the stepper motor to vary the battery load so as to regulate either the battery load current or the battery output voltage to a predetermined reference value, depending upon the test being performed. A selectively variable timer controls the time period during which the battery is loaded. A display indicates the reference values, the values of the parameters being regulated and the state of the timer.

12 Claims, 16 Drawing Sheets

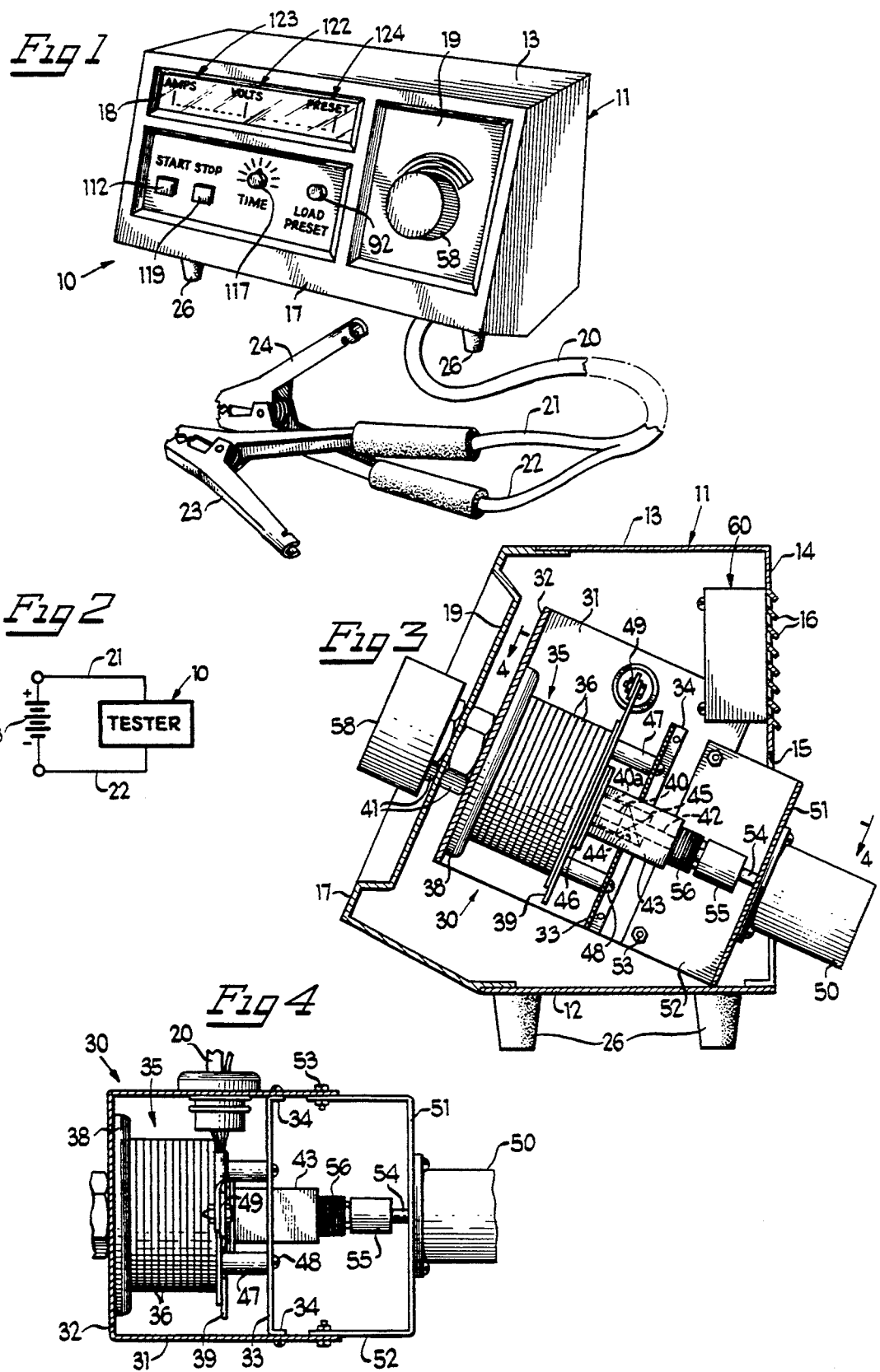

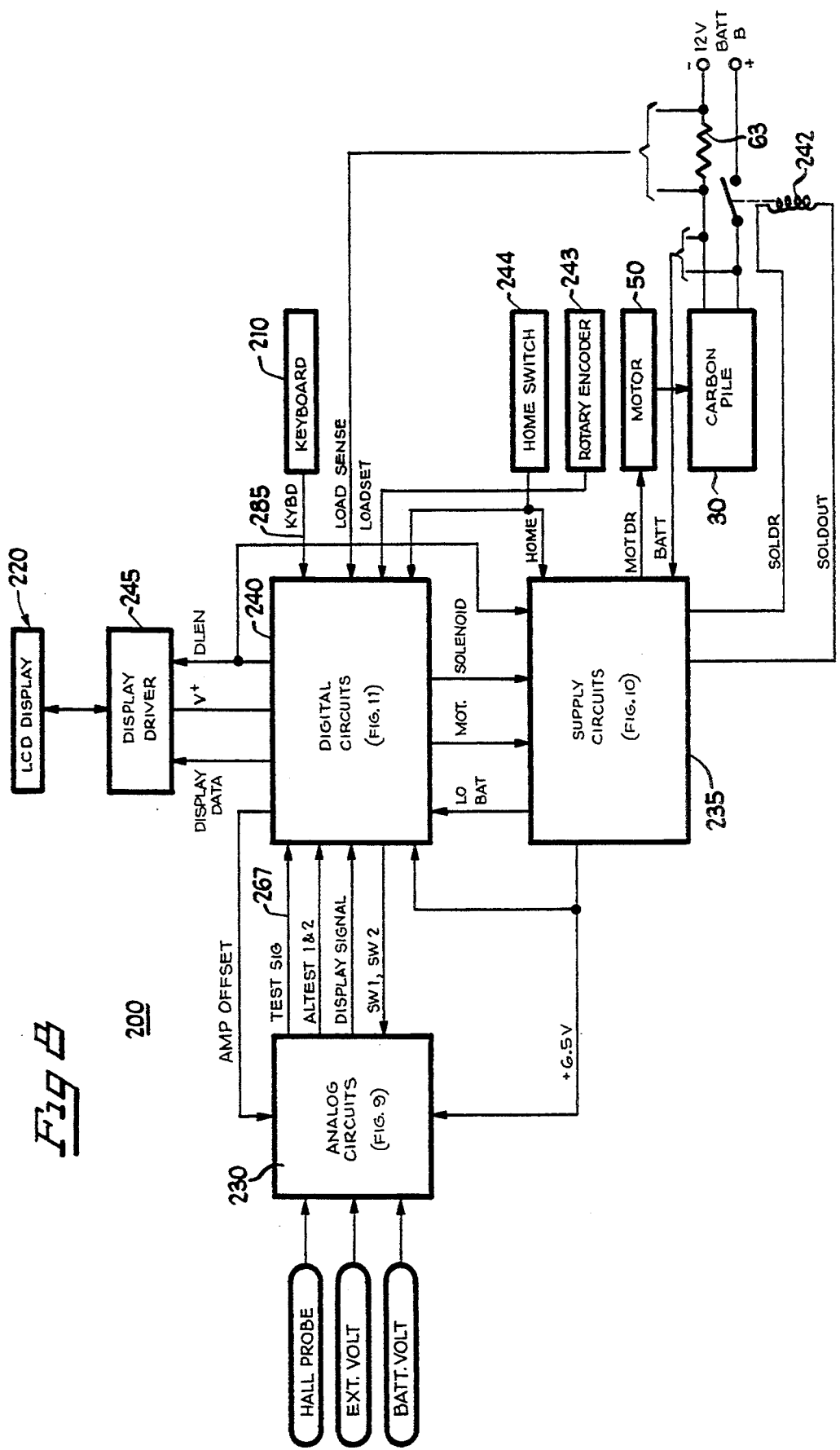

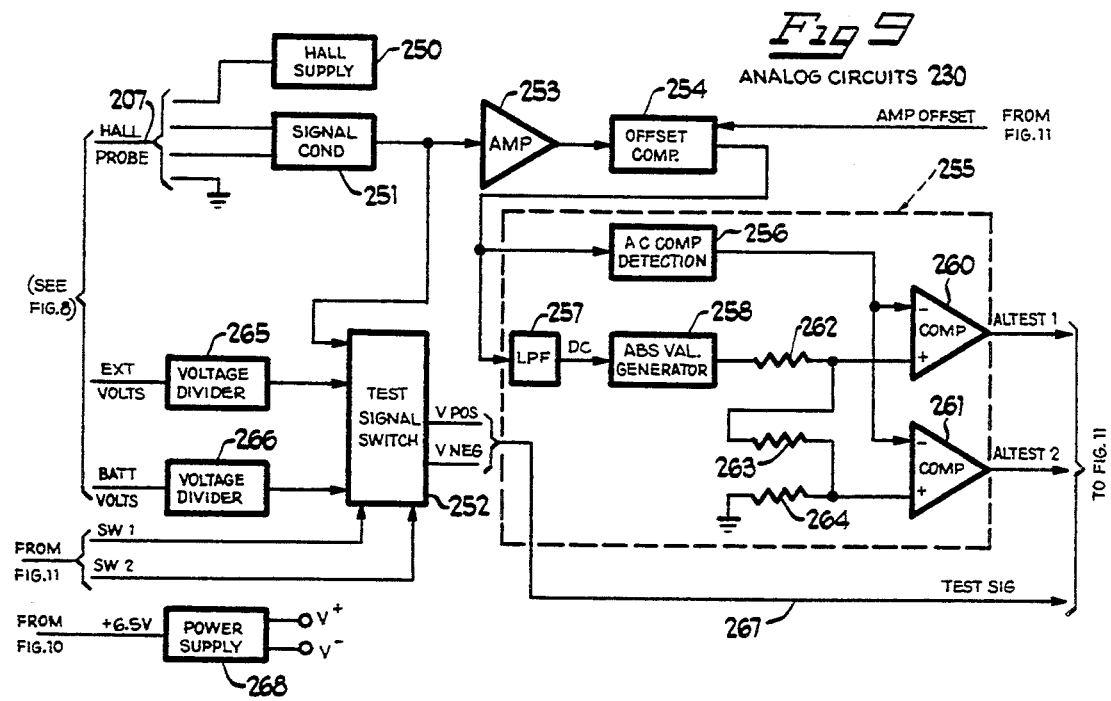
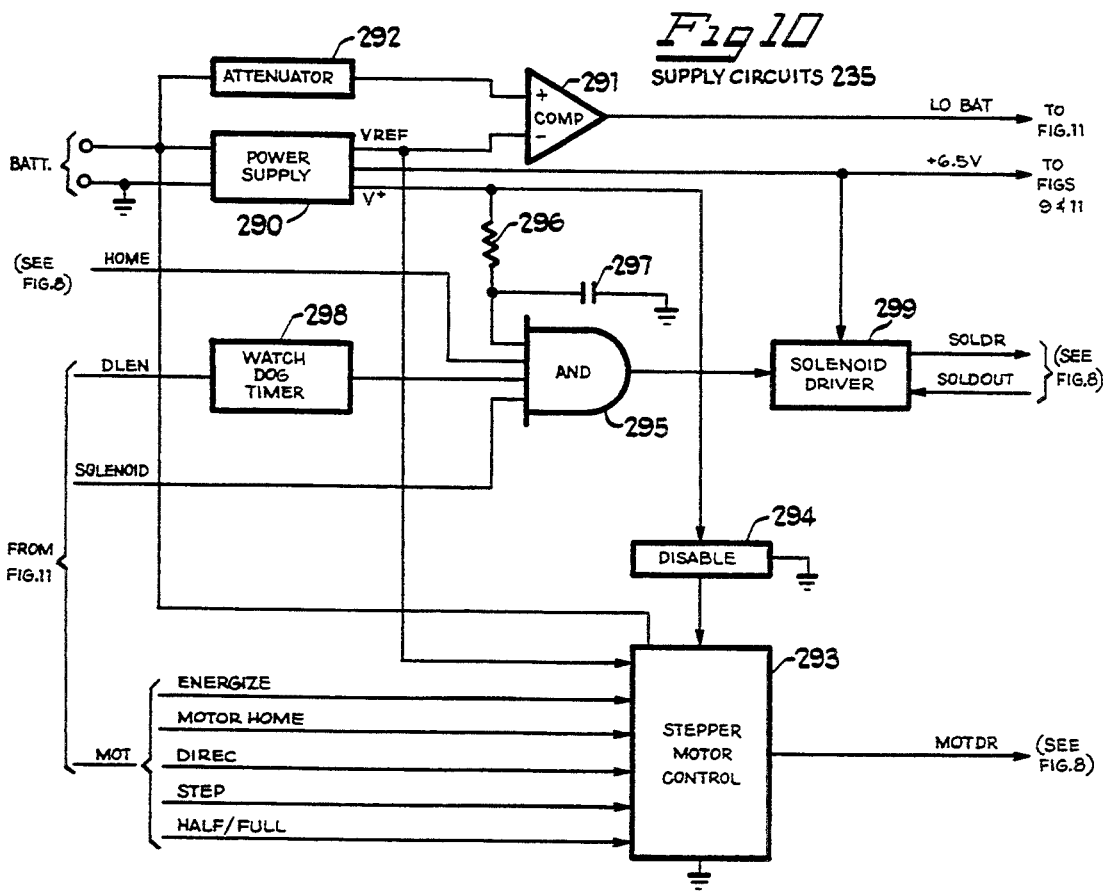

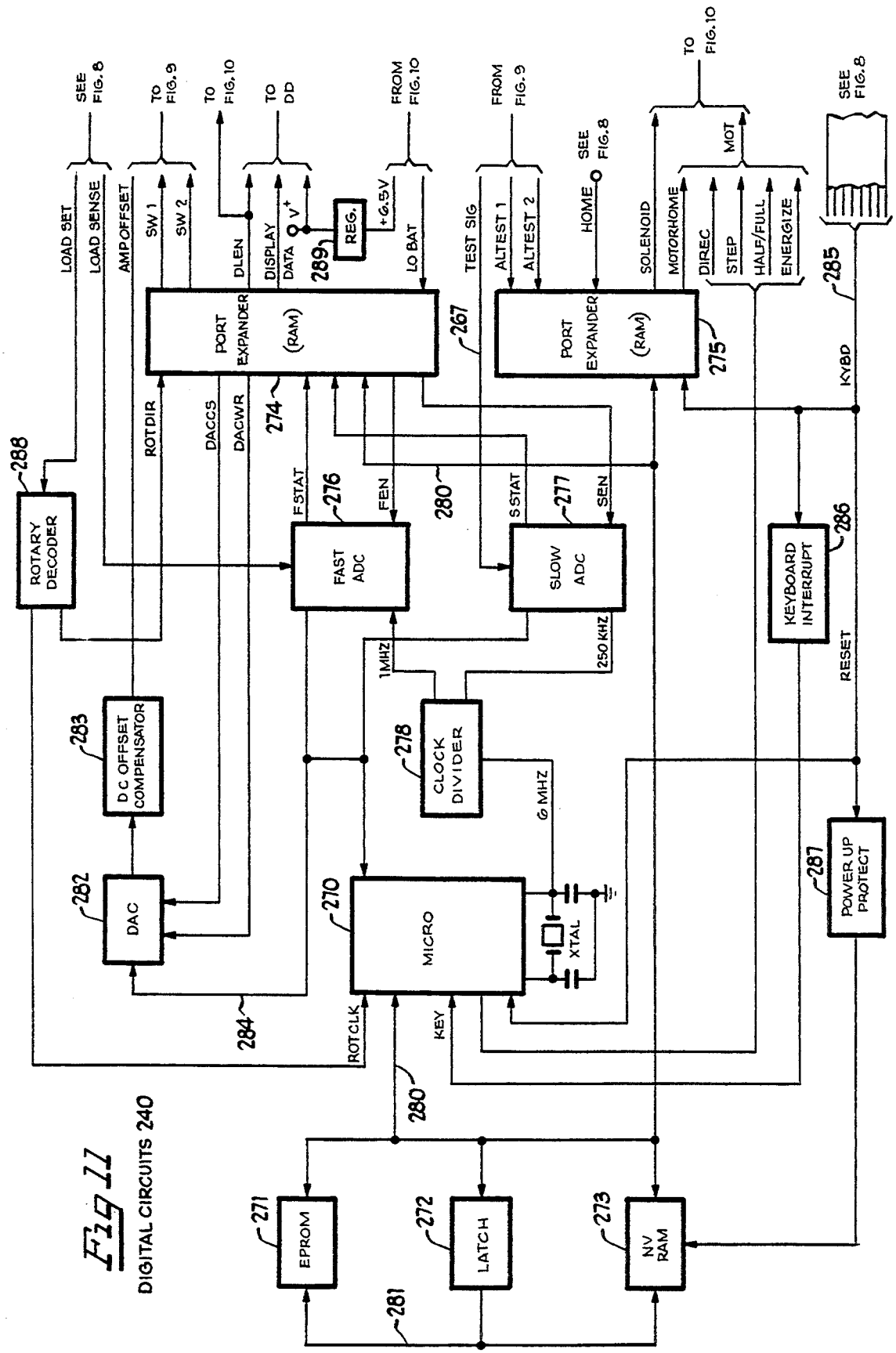

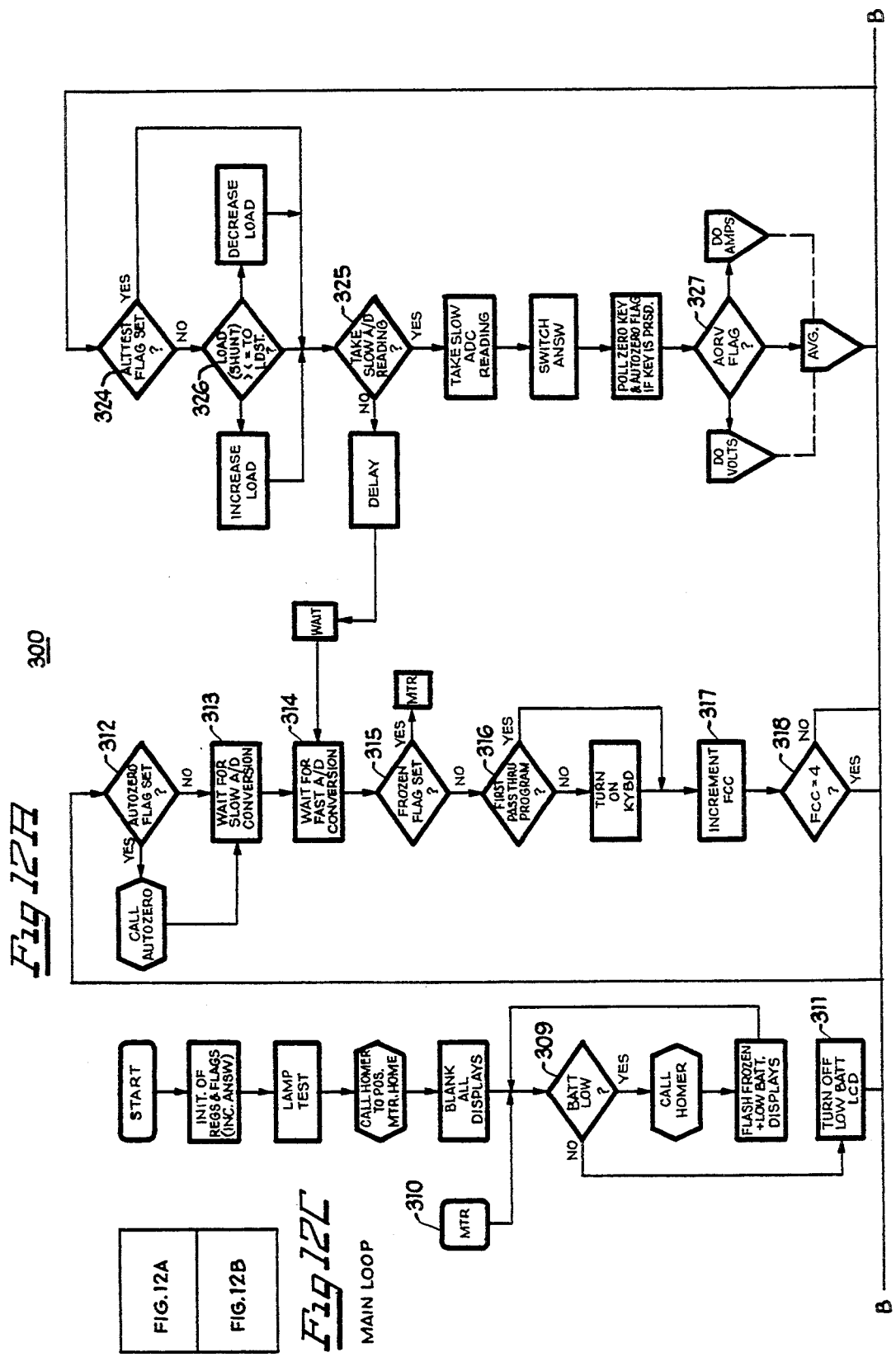

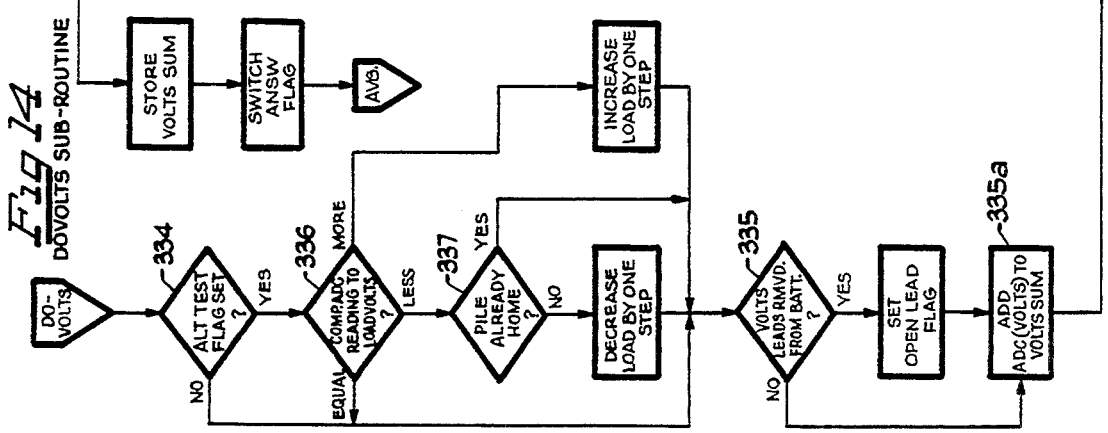
Fig. 14 DOVOLTS SUB-ROUTINE
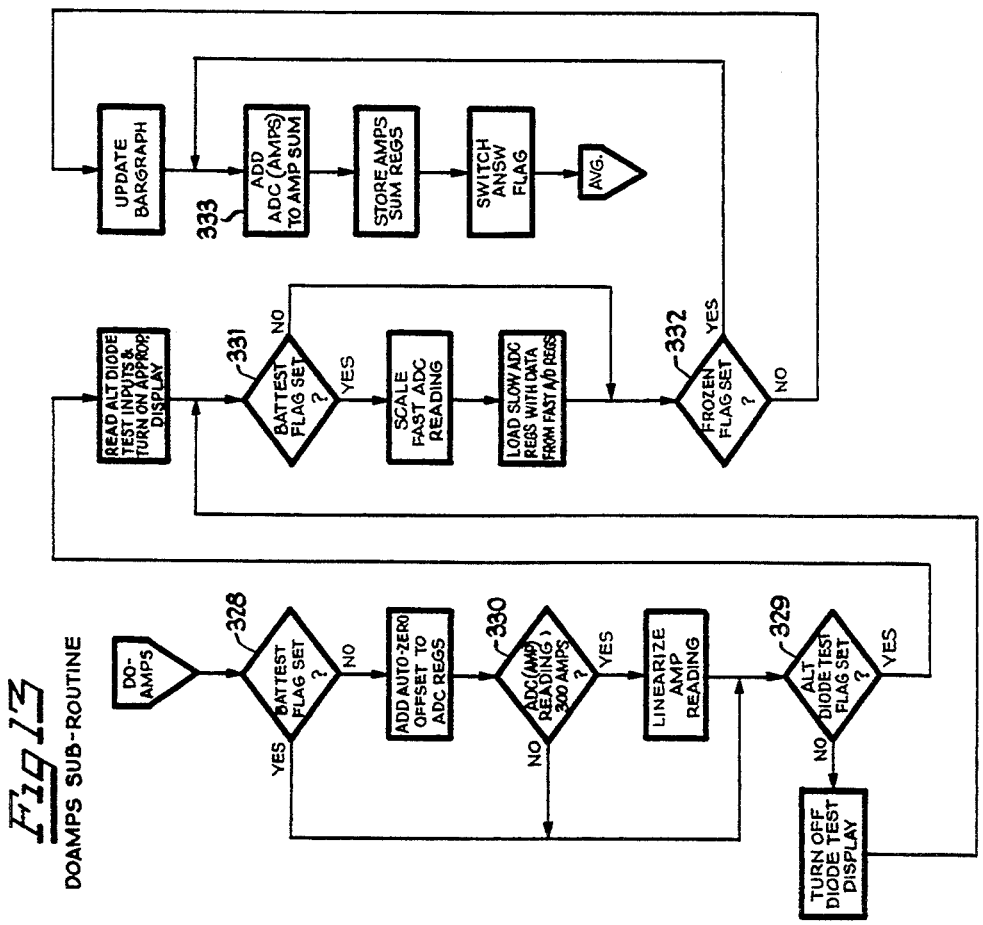
Fig. 13 DOAMPS SUB-ROUTINE

SPEEDY SUB-ROUTINE

DOAVERAGE SUB-ROUTINE

HOMER SUB-ROUTINE

GO HOME SUB-ROUTINE

ROTARY ENCODER INTERRUPT SUB-ROUTINE

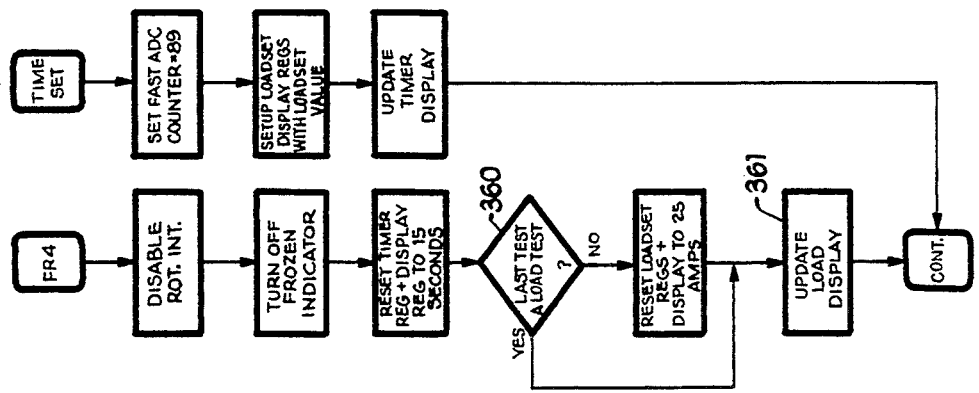
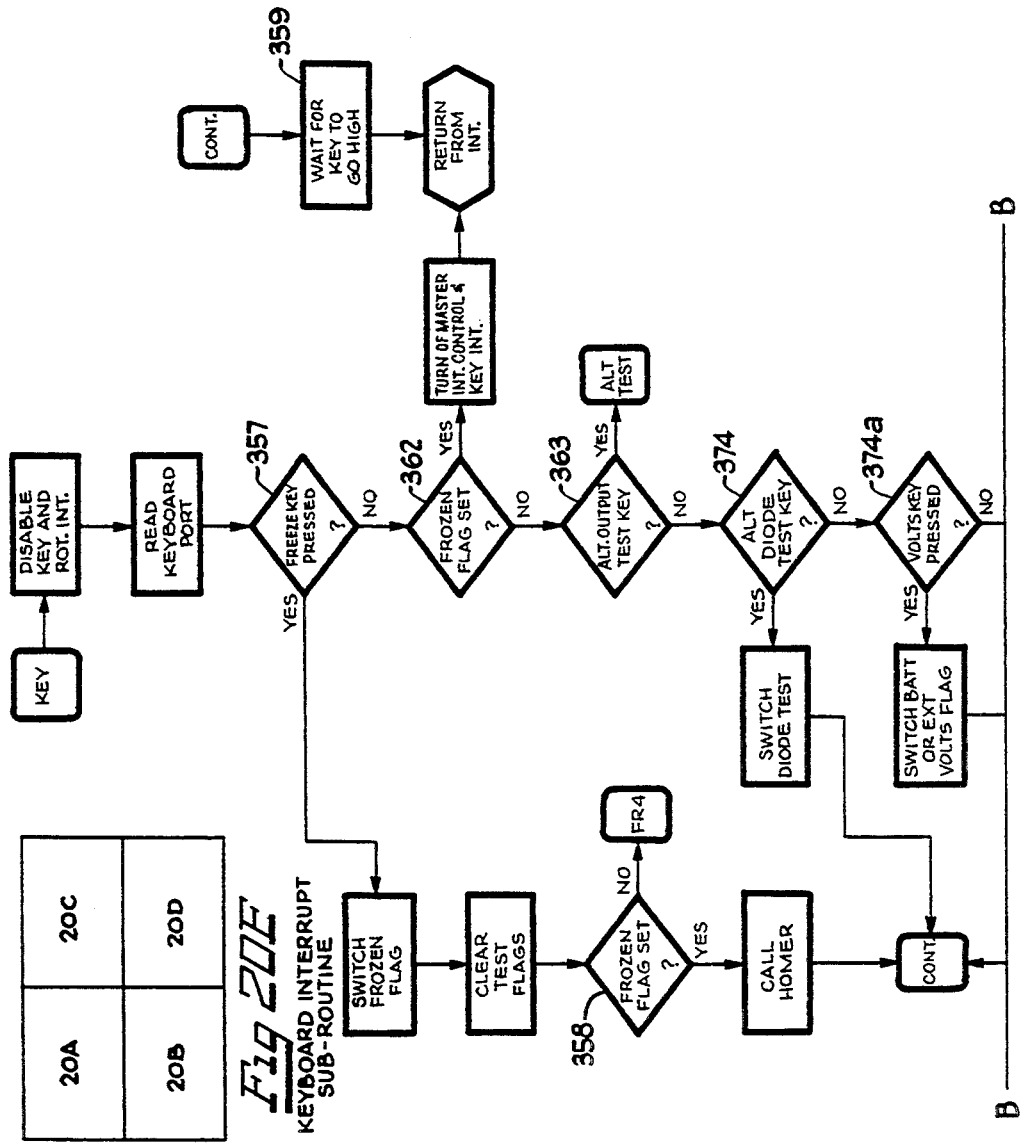
*Fig 20H*
*Fig 20E*
KEYBOARD INTERRUPT SUB-ROUTINE

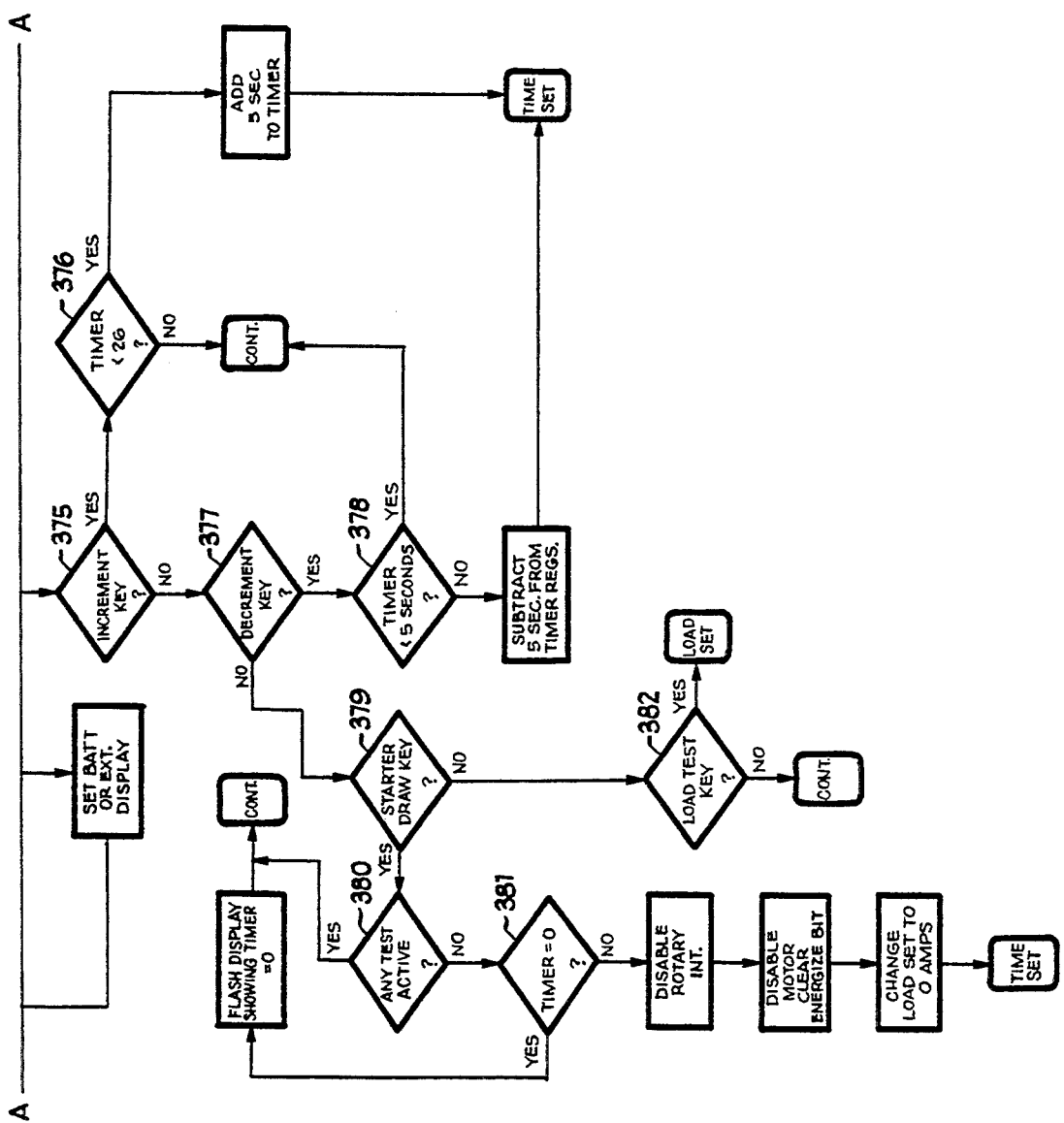

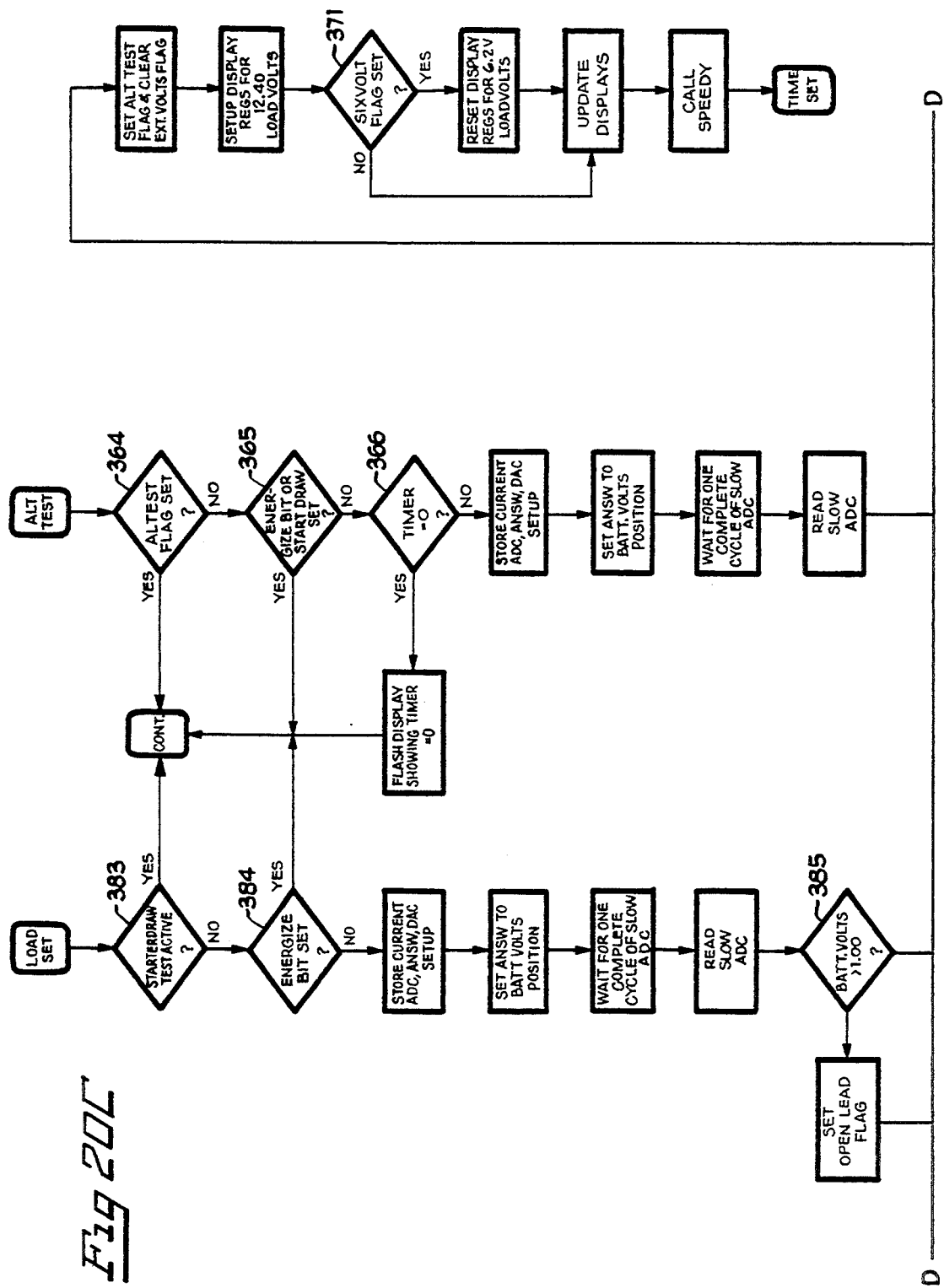

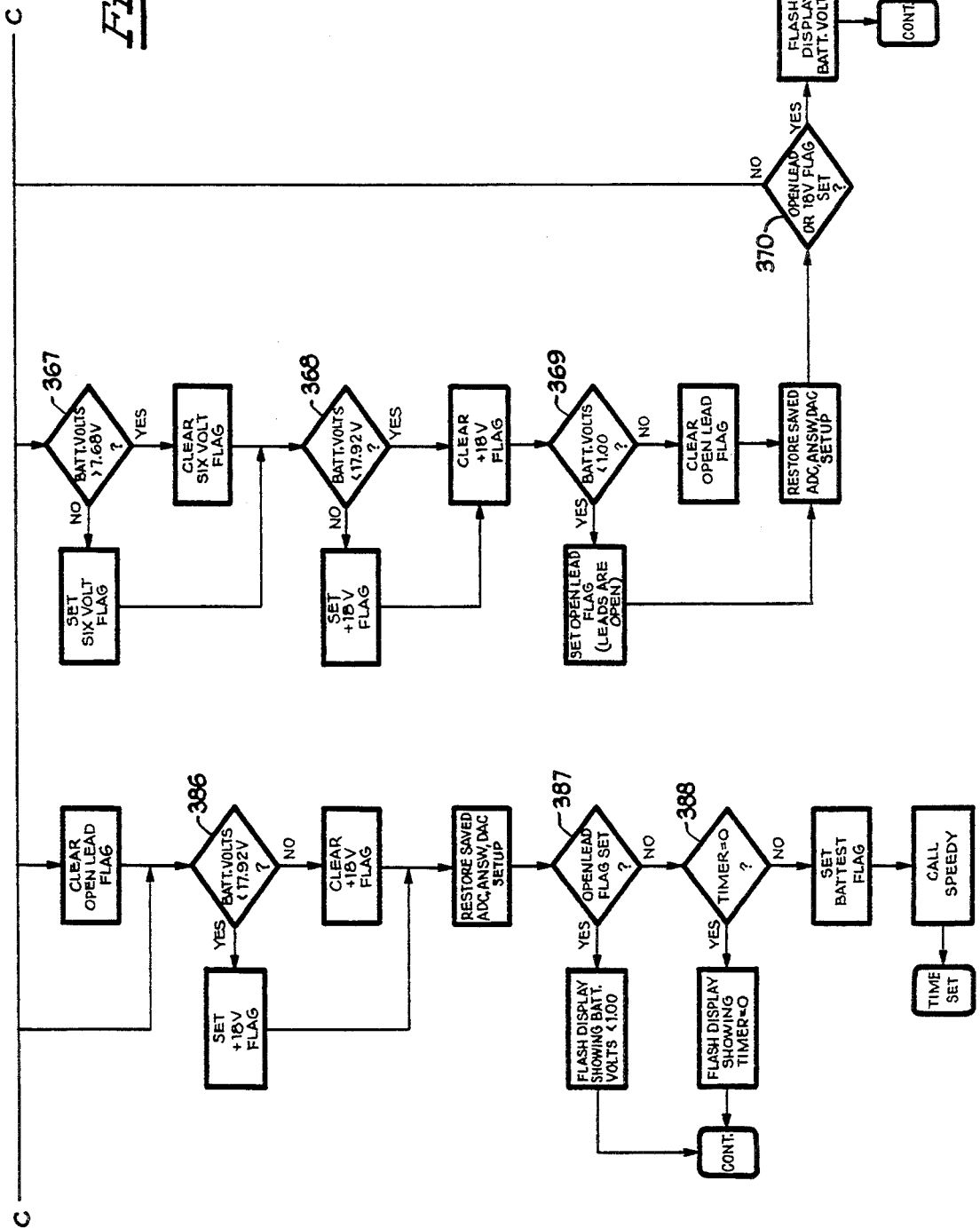

AUTOMATIC BATTERY AND CHARGING SYSTEM TESTER WITH MOTOR-DRIVEN CARBON PILE LOADING

RELATED APPLICATIONS

This is a divisional of application Ser. No. 07/751,704, filed Aug. 29, 1991, now U.S. Pat. No. 5,254,952 which is in turn a continuation-in-part of application Ser. No. 07/660,163, filed Feb. 25, 1991, now abandoned which is in turn a continuation of application Ser. No. 07/405,447, filed Sep. 11, 1989, now abandoned.

BACKGROUND OF THE INVENTION

1. Field of the Invention

The present invention relates to devices for testing batteries, such as automotive batteries, and the charging systems therefor. The invention relates in particular to devices for testing the output voltage of a battery and the output current of an alternator for charging the battery, when the battery is under loaded conditions.

2. Description of the Prior Art

One of the standard tests for an automotive battery is a test of its capacity by monitoring its output voltage when it is under a load. Such load testing of a battery involves loading of the battery to a specified load current (such as one-half the rated cold cranking amperage) for a given period of time (such as about fifteen seconds), while monitoring the battery output voltage. If it exceeds a predetermined minimum voltage, the battery capacity is deemed adequate. Loading is accomplished by installing a variable impedance element, such as a carbon pile, across the battery. The be electrical load resistance of the carbon pile is adjusted by manually turning a knob which is coupled to a threaded shaft which squeezes the carbon discs of the pile between a pair of brass plates. These brass plates are wired to the battery under test by means of heavy cables. Squeezing the carbon discs reduces the resistance between the discs, thereby increasing the load current through the battery.

Battery voltage is measured across the battery terminals using a voltmeter. Load current can be measured by scaling the voltage drop across a low-resistance, low-temperature-coefficient, series resistor or by using a nonintrusive, inductive probe with associated amplifiers. The user monitors the battery voltage while loading the battery with the carbon pile so as to maintain the specified load current.

The temperature within the carbon pile rises quickly as heavy current passes through it. This causes the resistance of the carbon pile to further decrease, thereby further increasing the load current. This is partly because carbon has a negative temperature coefficient of resistance, and also because the carbon discs may expand slightly with increased temperature, thereby effectively increasing the compression of the pile. The manual load control must, therefore, be continuously readjusted to maintain the load at about the predetermined current level throughout the test period, which is sometimes difficult to achieve. This difficulty is aggravated by the fact that the manual load control is biased to the zero load condition so that a high load will not inadvertently be left on the battery.

Loading of the battery is also involved in testing the alternator current output. For this test alternator current is measured directly by a suitable probe, such as a Hall effect current measuring probe encircling the alternator output cable. The automobile engine is operated at a moderate speed sufficient to ensure maximum alternator output, and then the battery load is varied with the carbon pile, while the operator monitors the alternator current output, taking note of and remembering the maximum current reading. If the maximum output current is sufficiently close to (e.g., within 10% of) the rated output, then the alternator is considered good.

It will be appreciated that this test operation is, of necessity, a two-person job or, at best, a difficult one-person job. Thus, one hand is required to hold the engine throttle to maintain a desired engine speed, another hand is required to manipulate the carbon pile, and then both battery output voltage and alternator current have to be simultaneously monitored. Most manufacturers specify a loaded battery output voltage at which the maximum alternator output should be achieved, so the operator must manipulate the carbon pile knob to attempt to maintain that load voltage. While he watches a voltage monitor to be sure that the proper voltage range is maintained, he must also constantly monitor an alternator output current display so that he does not miss the peak output current value.

SUMMARY OF THE INVENTION

It is a general object of the present invention to provide an improved battery and charging system test apparatus which avoids the disadvantages of prior test apparatus, while affording additional structural and operating advantages.

An important feature of the invention is the provision of a carbon pile load apparatus which is automatically feed-back controlled so as to regulate or maintain a specified parameter of the circuit being loaded.

Another feature of the present invention is the provision of an automatic battery loading apparatus.

In connection with the foregoing feature, it is another feature of the invention to provide a battery loading apparatus of the type set forth, wherein the loading element is a carbon pile.

Still another feature of the invention is the provision of a battery loading apparatus which will automatically regulate the load current at a predetermined level. Another feature of the invention is the provision of an apparatus for testing the output current of an alternator in a battery charging system while regulating the battery load voltage.

These and other features of the invention are attained by providing apparatus for automatically loading a test circuit in accordance with a variable parameter thereof which varies with the load, comprising: carbon pile electrical impedance means adapted to be connected in the test circuit for loading thereof, compression means coupled to the impedance means for varying the compression thereof and thereby effecting variation of the impedance thereof, feedback means coupled to the test circuit for sensing the variable parameter and producing a parameter signal which is a function of the parameter, and drive control means coupled to the compression means and to the feedback means and responsive to the parameter signal for automatically controlling the operation of the compression means to vary the impedance of the impedance means so as to regulate the parameter signal to a predetermined value.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there are illustrated in the accompanying drawings preferred embodiments thereof, from an inspection of which, when considered in connection with the following description, the invention, its construction and operation, and many of its advantages should be readily understood and appreciated.

FIG. 1 is a perspective view of a battery tester incorporating a carbon pile and constructed in accordance with and embodying the features of a first embodiment of the present invention;

FIG. 2 is a partially block and partially schematic circuit diagram illustrating the connection of the battery tester of FIG. 1 to an associated battery under test;

FIG. 3 is an enlarged view in vertical section through the battery tester of FIG. 1, illustrating the carbon pile thereof;

FIG. 4 is a fragmentary sectional view, taken along the line 4—4 in FIG. 3;

FIG. 8 is a partially schematic and partially functional block diagram of the circuitry of the tester of FIG. 6;

FIG. 9 is a partially schematic and partially block diagram of the analog circuits of the tester circuitry of FIG. 8;

FIG. 10 is a partially schematic and partially block diagram of the supply circuits of the tester circuitry of FIG. 8;

FIG. 11 is a partially schematic and partially block diagram of the digital circuits of the tester circuitry of FIG. 8; and FIGS. 12A,12B,13-19,20A,20B,20C and 20D are flow diagrams of the program routines for the microprocessor of the tester circuitry of FIG. 8, wherein FIG. 12C shows the relationship of FIGS. 12A and B, and FIG. 20E shows the relationship of FIGS. 20A-D.

DESCRIPTION OF THE PREFERRED EMBODIMENTS

Figure 5:
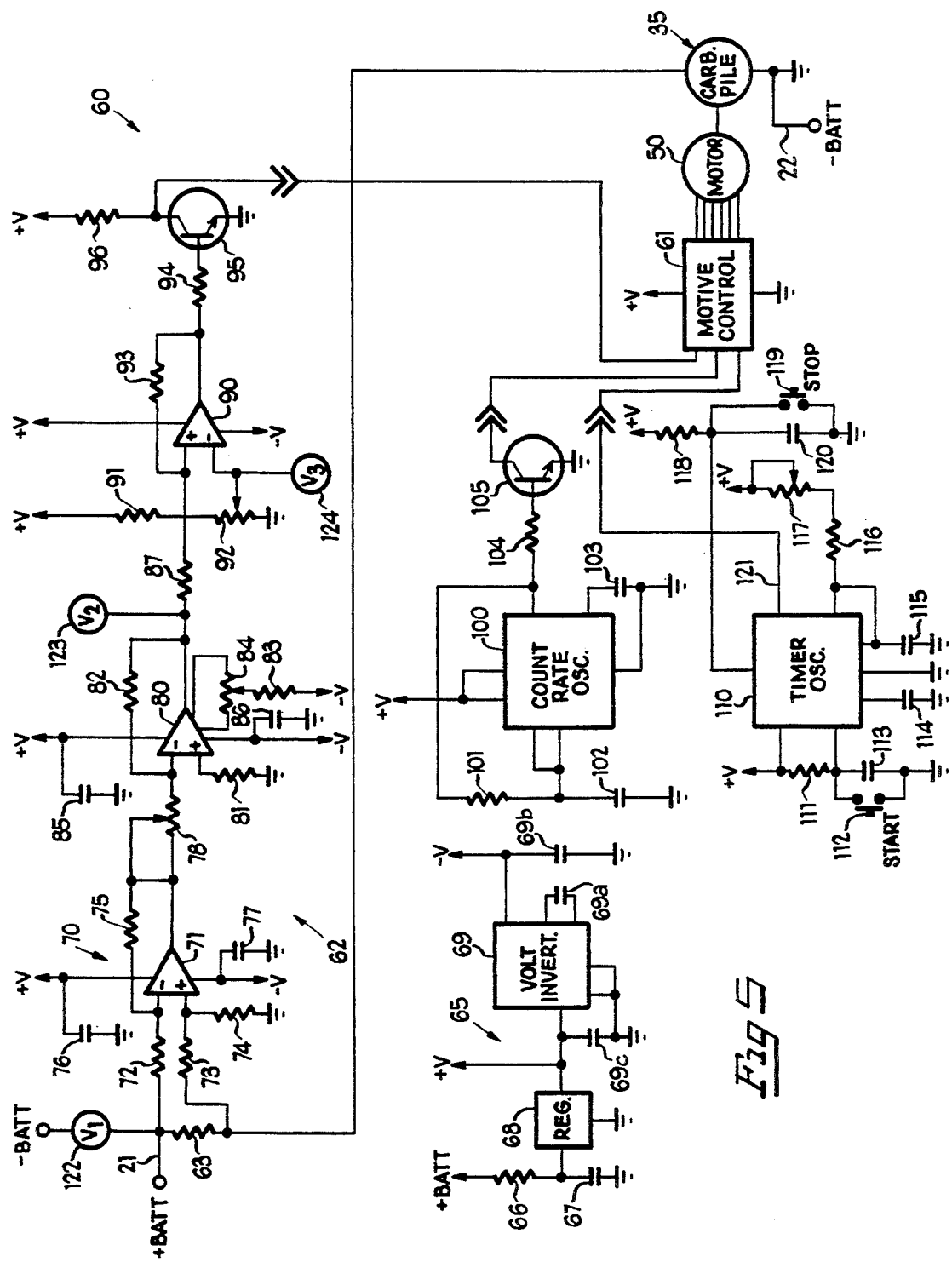
FIG. 5 is a schematic circuit diagram of the battery tester of FIG. 1.

Referring to FIGS. 1–3, there is illustrated a battery tester, generally designed by the numeral 10, constructed in accordance with and embodying the features of a first embodiment of the present invention. The battery tester 10 includes a cabinet 11 having a flat, rectangular bottom wall 12, a flat, rectangular top wall 13, and a rectangular rear wall 14 interconnecting the top and bottom walls 13 and 12 at the rear edges thereof. Formed in the rear wall 14 adjacent to a lower corner thereof is an opening 15, and formed in the rear wall 14 adjacent to the upper end thereof is a series of ventilation louvers 16. The front of the cabinet 11 is closed by a front panel 17 having a window 18 formed therein and provided with a rectangular recessed portion 19. A cable set 20 including cables 21 and 22 extends from the cabinet 11, the cables 21 and 22 being respectively provided at their outer distal ends with clamp connectors 23 and 24 for clamping onto the terminal posts of an automotive battery B (FIG. 2) in standard fashion. The bottom wall 12 may be provided with a plurality of support legs 26 for supporting the cabinet 11 on an associated support surface.

Referring now also to FIG. 4, a mechanically variable impedance in the form of a carbon pile assembly 30 is disposed in the cabinet 11. The carbon pile assembly 30 includes a generally U-shaped main mounting bracket 31 having a bight portion 32 and legs adapted to be coupled by suitable means to an associated wall structure (not shown) in the cabinet 11. The assembly 30 also includes a rear mounting bracket 33 which is generally channel-shaped and has a pair of attachment legs 34 respectively secured to the legs of the main bracket 31 for interconnecting same. A carbon pile 35 is disposed between the rear mounting bracket 33 and the bight 32 of the main mounting bracket 31, the carbon pile 35 including a plurality of annular carbon discs 36 stacked between front and rear brass terminal plates 38 and 39.

An elongated cylindrical shaft 40 (FIG. 3) extends coaxially through the carbon pile 35 for rotation with respect thereto. The forward end of the shaft 40 extends outwardly through a complementary opening in the recessed portion 19 of the cabinet front panel 17 and is axially retained in place with respect thereto by a suitable coupling including lock nuts 41. The shaft 40 is provided at its inner end with an externally threaded portion 42 which is threadedly engaged with a rectangular compression nut 43. The nut 43 has an axial recess 44 formed in the outer end thereof for receiving a cylindrical insulator 40a encircling the portion of the shaft 40 which passes through the carbon pile 35. Disposed in the recess 44 and encircling the shaft 40 is a helical compression spring 45 which bears against the cylindrical insulator and against the compression nut 43 at the inner end of the recess 44 therein for urging the nut 43 rearwardly.

A plurality of bearing washers 46 are, disposed about the shaft 40 between the compression nut 43 and the rear terminal plate 39. The terminal plate 39 is spaced from the rear mounting bracket 33 by a plurality of hollow cylindrical ceramic standoffs 47 which are secured to the rear mounting bracket 33 by fasteners 48, and which maintain a predetermined minimum separation between the rear mounting bracket 33 and the rear terminal plate 39. One cable of the cable set 20 is coupled by a suitable connection 49 to the rear terminal plate 39, while the other conductor is coupled by a suitable connection (not shown) to the front terminal plate 38.

The carbon pile assembly 30 also includes an electric stepper motor 50 which is fixedly secured to a bight 51 of a generally U-shaped mounting bracket 52, the legs of which are respectively fixedly secured by suitable fasteners 53 to the legs of the main mounting bracket 31. The motor 50 has an output shaft 54 which is coupled by a suitable coupler 55 to the shaft 40 for rotation thereof, a plurality of washers 56 being disposed between the coupler 55 and the compression nut 43. The front end of the shaft 40 which projects outwardly beyond the front panel 17 of the cabinet 11 is secured to a suitable adjustment knob 58 for effecting manual rotation of the shaft 40, as will be explained in greater detail below.

In operation, when the shaft 40 is rotated, the compression nut 43 travels axially therealong, either outwardly or inwardly, depending upon the direction of rotation of the shaft 40, the compression nut 43 being held against rotation by engagement with the mounting plate 33. As the compression nut 43 moves axially outwardly along the shaft 40 against the urging of the compression spring 45, it causes the washers 46 to bear against the rear terminal plate 39 for compressing the carbon pile 35 between the terminal plates 38 and 39. Compressing the carbon pile 35 reduces the resistance between the discs 36 in a well-known manner, the reduction in resistance being proportional to the magnitude of the compressive force exerted on the carbon pile 35. When the shaft 40 is rotated in the opposite direction, the compression nut 43 is moved away from the carbon pile 35, reducing the compressive force thereon and increasing the resistance thereof, the movement being aided by the spring 45. It will be appreciated that the shaft 40 may be rotated manually by the use of the adjustment knob 58, and may be rotated automatically by the use of the stepper motor 50.

Referring now also to FIG. 5 there is illustrated a control assembly, generally designated by the numeral 60, for controlling the operation of the stepper motor 50, and thereby the variation in the resistance of the carbon pile 35. The control assembly 60 includes a motive control circuit 61, which is preferably an integrated circuit which includes an up/down, eight-bit binary counter which can operate in either a count-up or a count-down mode to provide a bipolar chopper drive. The motive control circuit 61 provides a parallel binary output to the stepper motor 50, which is a bipolar motor and may be provided with a suitable gear reduction. The bipolar configuration uses 100% of the motor windings and current flow is switched in a known manner. This configuration provides a high output of torque at low speeds. It will be appreciated that, as the counter of the motive control circuit 61 counts up, the motor 50 rotates in a first direction to increase the compressive force on the carbon pile 35, thereby decreasing its resistance and increasing the load current drawn thereby. When the motive control circuit 61 counts down, the motor 50 is rotated in the opposite direction to decrease the load current drawn by the carbon pile 35.

The control assembly 60 is coupled to the cables 21 and 22, and the carbon pile 35 is connected across the cables 21 and 22. The control assembly 60 has a feedback circuit 62 which includes a feedback resistor 63 connected in series with the carbon pile 35. The control assembly 60 further includes a power supply circuit 65. More specifically, a resistor 66 and a capacitor 67 are connected in series between the positive battery voltage and ground, the junction between the resistor 66 and the capacitor 67 being coupled to the input of a voltage regulator 68, the output of which provides a regulated +V supply voltage which is preferably +5 VDC. The output of the voltage regulator 68 is also applied to a voltage inverter 69 which through the operation of associated capacitors 69a and 69b, generates a −V supply voltage, which is preferably −5 VDC. A bypass capacitor 69c provides stabilization to prevent oscillation in the power supply 65.

The voltage drop across the feedback resistor 63 is applied through a differential amplifier circuit 70 which includes an operational amplifier 71. More specifically, the positive and negative terminals of the feedback resistor 63 are respectively coupled through resistors 72 and 73 to the inverting and non-inverting input terminals of the operational amplifier 71. Also connected between the non-inverting input terminal and ground is a resistor 74. The output terminal of the operational amplifier 71 is coupled through a feedback resistor 75 to the inverting input terminal. The +V and −V supply voltages are applied to the operational amplifier 71, with capacitors 76 and 77 providing noise-reducing shunts to ground.

The feedback resistor 63 may have a resistance of 250 micro-ohms, in which case a current of 500 amps therethrough will develop a voltage drop across it of 125 millivolts. The amplifier 70 provides a differential input circuit which references the voltage drop across the feedback resistor 63 to ground. It will be appreciated that the voltage drop across the feedback resistor 63 is proportional to the load current through the carbon pile 35. The operational amplifier 71 is preferably set to a gain of −1.

The output of the operational amplifier 71 is coupled through a trim pot 78 to the inverting input terminal of a scale adjustment operational amplifier 80, which is arranged in an inverting configuration with the non-inverting input terminal thereof being coupled through a resistor 81 to ground. The output terminal of the operational amplifier 80 is coupled through a feedback resistor 82 to the inverting input terminal. The +V and −V supply voltages are applied directly to the operational amplifier 80 through connections which are respectively provided with suitable noise bypass capacitors 85 and 86. The −V supply voltage is also applied through a resistor 83 and a potentiometer 84. The gain of the operational amplifier 80 is established by the ratio of the resistance of the feedback resistor 82 to that of the trim pot 78. The resistor 81 serves to limit input offset currents, and the resistor 83 and the potentiometer 84 provide offset voltage compensation. Preferably, the gain of the operational amplifier 80 is set at −4, yielding an output of 0.5 volts for the −0.125 volt input from the differential amplifier 70.

The output of the operational amplifier 80 is coupled through a resistor 87 to the non-inverting input terminal of an operational amplifier 90, which is configured as a voltage comparator. The inverting input terminal of the operational amplifier 90 is coupled to the wiper of a potentiometer 92, which is connected in series with a resistor 91 between the +V supply and ground. The +V and −V supply voltages are also applied directly to the operational amplifier 90. The output terminal of the operational amplifier 90 is coupled through a feedback resistor 93 to the non-inverting input terminal thereof. The potentiometer 92 is preferably mounted on the front panel 17 of the cabinet 11, and a preset voltage is established through the resistor 91 and the potentiometer 92, the values of which are selected to provide a 0 to 0.5 volt range into the inverting input terminal of the operational amplifier 90. The resistor 93 provides hysteresis across the comparator to slow down the "searching" rate of the feedback-control circuit 62. Functionally, when the scaled load "feedback" voltage from operational amplifier 80 is lower than the preset level, the output of the operational amplifier 90 is low (e.g., −5 volts). When the output from the operational amplifier 80 is higher than the preset level, the output of the operational amplifier 90 is high (e.g. +5 volts).

The output from the comparator operational amplifier 90 is applied through a resistor 94 to the base of a transistor 95, the emitter of which is grounded and the collector of which is coupled through a resistor 96 to the +V supply. The collector of the transistor 95 is also coupled to the motive control circuit 61. The transistor 95 functions as an inverter and serves to make the output from the comparator operational amplifier 90 single-ended, i.e., non-negative going. Thus the low output from the operational amplifier 90 will become +5 volts, corresponding to a logical "1", while the high output from operational amplifier 90 will become 0 volts, corresponding to a logical "0". The resistor 94 provides current limiting into the base of the transistor 95, and the resistor 96 provides the collector load. The collector of the transistor 95 provides a direction control signal to the motive control circuit 61 to tell it in which direction to count, for thereby controlling the direction of rotation of the stepper motor 50.

The count-up, count-down function is provided by an integrated circuit count rate oscillator 100. The oscillator 100 is provided with the +V supply voltage and has an oscillator input coupled through a resistor 101 to the output terminal of the oscillator and through a capacitor 102 to ground, the values of the resistor 101 and the capacitor 102 determining the count rate. A bypass capacitor 103 is connected to ground to stabilize the oscillator 100 and to eliminate spikes from the high speed switching of the motive control circuit 61. The oscillator 100 is a free running oscillator and preferably has an output of about 300 Hz, which is applied through a resistor 104 to the base of a transistor 105, which is configured as an inverter, with its emitter grounded and with its collector providing an output signal to the motive control circuit 61.

The control assembly 60 also includes an integrated circuit timer oscillator 110. A resistor 111 is connected across input terminals of the timer oscillator 110, the resistor 111 being connected in series with a normally-open push-button start switch 112 between the +V supply voltage and ground. A capacitor 113 is connected in parallel with the start switch 112. Capacitors 114 and 115 are connected to other terminals of the timer oscillator 110. A resistor 116 and a trim pot 117 are connected in series between the +V supply and another input terminal of the timer oscillator 110. Another input terminal of the timer oscillator 110 is connected through a resistor 118 to the +V supply voltage and through a normally-open push-button stop switch 119 to ground, a capacitor 120 being connected in parallel with the stop switch 119. The timer oscillator 110 has an output terminal 121 coupled to the motive control circuit 61.

In operation, when the start switch 112 is closed, the timer oscillator 110 starts to time out a predetermined time period, which time period is set by the values of the capacitor 115 and the combined resistance of the resistor 116 and the trim pot 117. When the timer is triggered, the timer oscillator 110 will produce an output signal on its output terminal 121 to the motive control circuit 61 to enable that circuit, this output signal continuing as long as the timer is operating. The stop switch 119 is connected so that if it is closed before the timer has timed out, it will terminate the output signal on the conductor 121 and reset the timer to zero. The resistors 111 and 118 are pull-up resistors for the start switch 112 and the stop switch 119, respectively, and the capacitors 113 and 120 are for noise reduction and the capacitor 114 is for stabilization and spike elimination. Preferably, the start switch 112 and the stop switch 119 are mounted on the front panel 17 of the cabinet 11. Preferably, the predetermined time period of the timer oscillator 110 is set for about a 15-second test period. The potentiometer 117 may be mounted on the front panel 17 of the cabinet 11.

Preferably, indicating meters are provided for monitoring the operation of the battery tester 10. In particular, a voltmeter 122 is coupled across the battery terminals, i.e., across the cables 21 and 22, to continually monitor the output voltage of the battery B. A volt meter 123 may be connected to the output terminal of the scale adjust operational amplifier 80 for monitoring the scaled feedback voltage measured across the feedback resistor 63, which is proportional to the load current through the carbon pile 35. The meters 122 and 123 may be mounted inside the front panel 17 of the cabinet 11 for display through the window 18. The meter 123 may be calibrated in amperes to directly read the load current. There may also be provided a meter 124 coupled to the wiper of the potentiometer 92 for monitoring the preset voltage level, which is proportional to the predetermined load current which is to be maintained by the control assembly 60. This meter may also be calibrated to read load current directly, and may also be mounted in the cabinet 11 for display through the window 18 or another suitable window.

In operation, the potentiometer 117 is adjusted to set the predetermined time period of the timer oscillator 110. The clamp connectors 23 and 24 are then connected to the terminals of the battery B and the carbon pile 35 is manually adjusted by means of the adjustment knob 58 to zero the carbon pile 35, i.e., to relieve the pressure on it until a substantially zero load current reading is obtained on the meter 123. The potentiometer 92 is adjusted until the meter 124 reads the desired predetermined load current which is to be maintained during the battery test.

The start switch 112 is then closed, triggering the timer oscillator 110 to initiate the predetermined time period and generate the output signal on terminal 121 for enabling the motive control circuit 61. Since the carbon pile 35 has been initially zeroed, there will initially be a negligible load current. Thus, the voltage measured by the meter 123 will be much less than the preset voltage, so that the output of the comparator 90 will be a logical "0", which causes the counter in the motive control circuit 61 to operate in a count-up mode to start to count at the rate determined by the count rate oscillator 100 to step the motor 50 in a first direction for compressing the carbon pile 35. The load current through the carbon pile 35 will rapidly increase as it is compressed until the feedback voltage, as measured by the meter 123, is substantially equal to the preset voltage, as measured by the meter 124.

Should the temperature of the carbon pile 35 cause a reduction of load, the counter of the motive control circuit 61 is again switched into the count-up mode for maintaining the predetermined load current. Similarly, should the feedback voltage increase beyond the preset value, the counter in the motive control circuit 61 is switched into a count-down mode to reduce the applied load to the predetermined level. The feedback circuit 62 will continue to "hunt" in this manner about the predetermined load level until the predetermined time period of the timer oscillator 110 terminates. Upon removal of the output signal from the timer oscillator 110, the counter in the motive control circuit 61 will count back down to zero for essentially removing the load applied by the carbon pile. During the test, the operator will monitor the voltmeter 122 to determine the loaded output voltage of the battery B.

In a constructional model of the battery tester 10, the operational amplifiers 71 and 80 may be of the type designated LM725C and sold by National Semiconductor, while the operational amplifier 90 may be of the type designated LM393 and sold by Motorola. The voltage regulator 68 may be of the type designated LM7805 and sold by National Semiconductor. The voltage inverter 69 may of the type designated ICL7660N sold by Intersil. The count rate oscillator circuit 100 and the timer oscillator circuit 110 may both be timer circuits of the type designated LM555 and sold by National Semiconductor. The motive control circuit 61 may be a bipolar motor drive driver module of the type designated GS-D200 and sold by SGS Thomson, or a bipolar stepper drive of the type designated SD2 and sold by PKS Digiplan Ltd.

Figure 6:
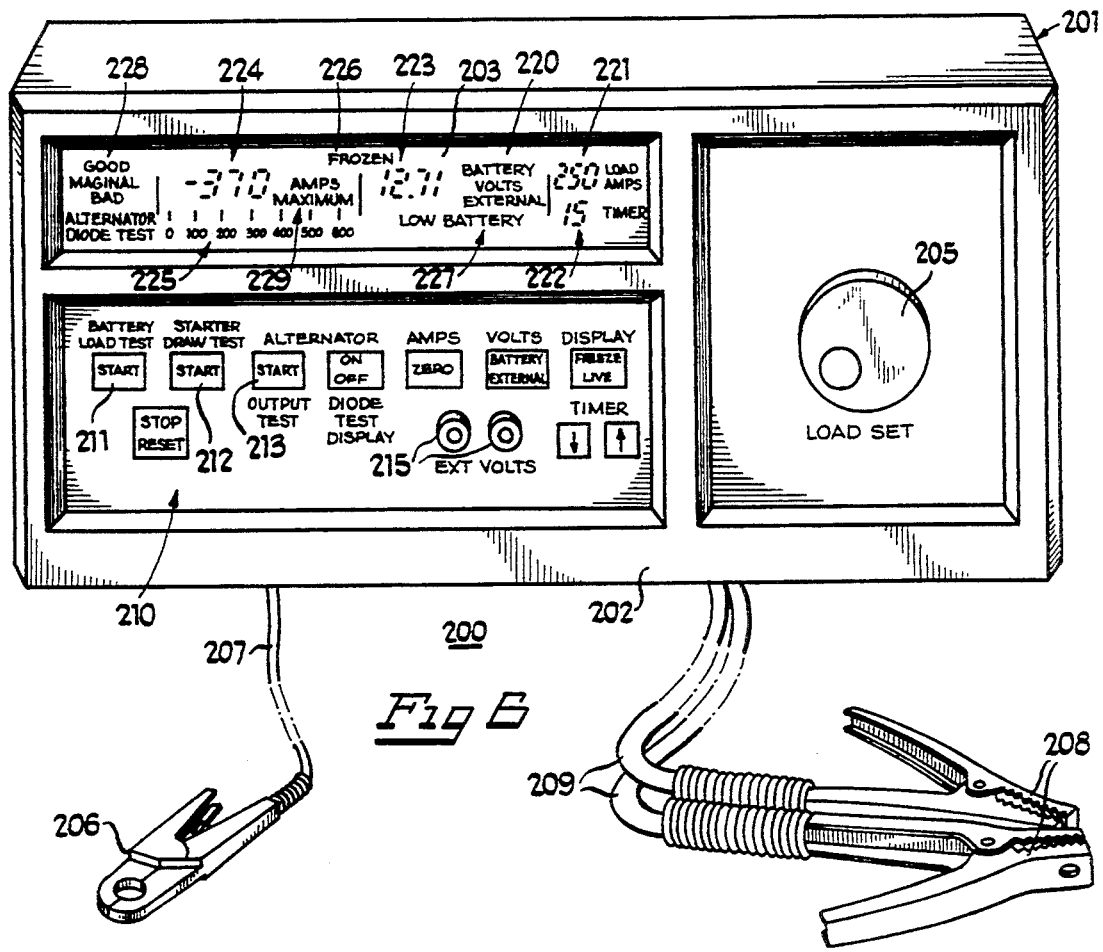
FIG. 6 is a perspective view of a battery and charging system tester constructed in accordance with and embodying the features of a second embodiment of the present invention, which incorporates the carbon pile of FIGS. 3 and 4.
Figure 7:
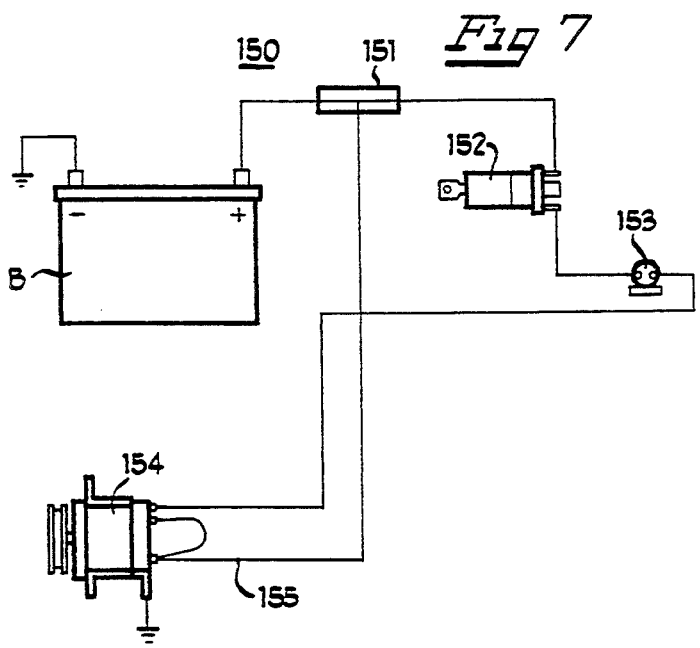
FIG. 7 is a schematic circuit diagram of an automotive battery and charging system of the type with which the testers of FIGS. 1 and 6 are designed to be used.

In FIG. 6, there is illustrated an alternative tester 200, constructed in accordance with another embodiment of the invention, for use in testing an automotive battery B or a charging system 150 therefor, of the type illustrated in FIG. 7. In the charging system 150, the positive terminal of the battery B is connected through a junction block 151, an ignition switch 152 and an indicator light 153 to the internal regulator of an alternator 154, the output of the alternator 154 being connected by a conductor 155 through the junction block 151 to the battery B. It will be appreciated that the alternator 154 converts mechanical energy from the auto vehicle engine to an alternating electrical current ("AC"), and then rectifies the AC into direct current ("DC") for charging the battery B. While most recent automobiles have alternators with internal regulators, it will be appreciated that the charging system 150 could also include an alternator with an external voltage regulator.

Referring now to FIG. 6, the tester 200 is housed in a box-like cabinet 201 having a rectangular front panel 202 with a rectangular window 203 in the upper portion thereof covering an LCD display panel 220, for viewing thereof. It will be appreciated that a carbon pile assembly 30 of substantially the same type as is illustrated in FIGS. 3 and 4, is housed in the cabinet 201. A load set knob 205 is disposed on the front panel 202, but it is not coupled to the shaft 40 of the carbon pile assembly 30. Rather, it is coupled to the shaft of a rotary encoder 243 (see FIG. 8), which is mounted behind the front panel 202. The tester 200 is provided with a Hall probe 206 coupled to the circuitry in the cabinet 201 by a cable 207, and is also provided with a pair of battery clamps 208, which are respectively connected by cables 209 to the circuitry of the tester 200. Also formed on the front panel 202 is a keyboard 210 including three START keys 211, 212 and 213, an ON/OFF key, a ZERO key, a BATTERY/EXTERNAL key, a FREEZE/LIVE key, a STOP/RESET key, and up and down arrow keys. Also projecting from the front panel 202 are a pair of External Volts terminals 215.

The LCD display panel 220 includes a number of different displays. A load display 221 indicates the preset load (either in amps or volts, depending upon the test being conducted), which may be a programmed default load or a load manually set by the operator with the load set knob 205. A timer display 222 indicates, in seconds, the time remaining in a selected test. A volts display 223 indicates the voltage being monitored, and also indicates whether it is "Battery" volts, in the event that the battery is being tested, or "External" volts, in the event that some other voltage in the charging system 150 is being monitored. A current display 224 indicates, in amps, the current being monitored, either battery load current or alternator output current, depending upon the test being conducted. This current is also displayed graphically in a bar graph display 225. A "Frozen" display 226 will flash (and all of the other displays will be frozen) when the Freeze mode is selected. A "Low Battery" display 227 will flash if the battery voltage is too low to safely operate the stepper motor 50 of the carbon pile assembly 30. An alternator diode test display 228 may be selectively turned on to indicate whether the diodes of an alternator under test are "Good", "Marginal" or "Bad". When the current reading frozen on the current display 224 is the maximum current read during an alternator test, a "Maximum" display 229 will be illuminated next to the current display 224.

The tester 200 is designed to operate in a number of different modes for performing a number of different diagnostic tests on a battery and/or the charging system 150 therefor as well as on the engine starting system. However, the present invention deals specifically with only the following tests:

1. Battery Load Test;
2. Alternator Test, including alternator load test and diode test;

Accordingly, only so much of the hardware and software of the tester 200 will be described in detail herein as is necessary for a complete understanding of the construction and operation thereof as regards the above-listed tests.

The Battery Load Test is initiated by depressing the START key 211, and it monitors the battery output voltage while the battery is being loaded by the carbon pile assembly 30 to a predetermined load current. The Alternator Test is initiated by depressing the START key 213, and it monitors the alternator output current while the battery is being loaded by the carbon pile assembly 30 so as to maintain a predetermined battery output voltage. During this test, the alternator diodes are also tested, the results of the test being indicated in the alternator diode display 228, which is toggled on and off by use of the ON/OFF key. It is also possible to conduct a Starter Draw Test, which is initiated by depression of the START key 212, for monitoring the current draw on the battery B during operation of the starter motor (not shown). Other tests on the charging system 150 may also be conducted by the tester 20. Thus, various voltages in the charging system 150 or starting system may be monitored by the use of appropriate probe conductors (not shown) connected to the External Volts terminals 215. The volts display 223 may be toggled between the "Battery" and "External" indications by use of the BATTERY/EXTERNAL key, depending upon whether the voltage input being monitored is connected at the battery cables 209 or the External Volts terminals 215.

At the end of a test, the volts display 223 will be frozen at the last voltage reading and the current display 229 will be frozen at either the last amps reading or, in the case of an Alternator Test, at the maximum amps reading registered during the test. In this latter case, the "Maximum" display 229 will also be activated. At any time the operator may freeze the displays by pressing the FREEZE/LIVE key, which will also cause the "Frozen" display 226 to flash. Selecting the freeze mode will also terminate any test which was in progress. The displays will remain frozen until the FREEZE/LIVE key is again toggled.

A timer in the tester 200 is set at a default time, e.g., 15 seconds, for both the Battery Load Test and the Alternator Test. The timer is triggered by actuation of the appropriate START key, and when the timer times-out the selected test will terminate. However, the user can manually increment or decrement the timer to increase or decrease the test time at any time before or during a test, by actuation of the up and down arrow keys. The user may also, at any time, stop a test in progress and reset all the displays in the LCD display panel 220 by actuating the STOP/RESET key. If the ZERO key is actuated, the current display 224 will be zeroed, i.e., the current then being registered will be considered to be the zero level, as explained more fully below.

Referring now also to FIG. 8, the circuitry of the tester 200 will be generally described. The signals acquired by the several probes and leads are applied to analog circuits 230. More specifically, there is input to the analog circuits 230 a HALL PROBE signal, which is a current signal from the Hall probe, a BATT VOLT signal from the battery clamps 208 and an EXT VOLT signal from the leads (if any) connected to the External Volts terminals 215. The Hall probe cable 207 contains a number of conductors (see FIG. 9), and the Hall probe 206 is in the form of a pliers-type clamp which contains a Hall integrated circuit chip and is adapted to be clamped in encircling relationship about a current-carrying conductor, such as the alternator output conductor 155, for sensing the current therethrough in a known manner. Each of the battery clamp cables 209 is in the nature of a heavy bundle of copper wires adapted for carrying large currents, but in the center of the bundle is a separately insulated messenger wire. It is from these messenger wires that the BATT VOLT signal is obtained. This is so that the BATT VOLT signal will not be affected by any voltage drop which may occur in the heavy gauge, high-current portion of the cables 209.

The carbon pile assembly 30 is connected in series with the feedback resistor 63 and the normally-open contacts of a solenoid 242 across the terminals of the battery B. The solenoid 242 is driven by an SOLDR signal from the supply circuits 235 and returns a signal SOLDOUT to the supply circuits 235. The voltage drop across the feedback resistor 63 is fed back to the digital circuits 240 as a LOAD SENSE signal which is an indication of the current through the battery. The voltage across the carbon pile is also applied as a BATT signal to the supply circuits 235 which generate therefrom a +6.5 V supply which is, in turn, returned to the analog circuits 230, as well as to digital circuits 240 for powering various circuits therein. The BATT signal is also provided to a motor controller in the supply circuit 235 which supplies drive current, in the form of a MOTDR signal, for driving the stepper motor 50 for compressing and decompressing the carbon pile assembly 30. The load set knob 205 is associated with the rotary encoder 243, which outputs to the digital circuits 240 a digital LOADSET signal which indicates the degree of rotation of the load set knob 205 and, therefore, the reference carbon pile load value to which the battery B is be to regulated during a test. The carbon pile assembly 30 has a "home" position in which no compressive force is being applied to the carbon pile, and it is provided with a home switch 244 which is closed when the carbon pile assembly 30 is in its home position, to output a HOME signal to the supply circuits 235 and the digital circuits 240.

The keyboard 210 is connected to the digital circuits 240 by a cable 285 which includes a number of conductors corresponding, respectively, to the several keys on the keyboard 210. The digital circuits 240 are connected by a number of lines to the analog circuits 230 and to the supply circuits 235. These are functionally indicated by single lines in FIG. 8, but it will be appreciated that they may contain more than one conductor. Thus, a TEST SIG signal, ALTEST 1 & 2 signals, and a DISPLAY SIG signal are applied to the digital circuits 240 from the analog circuits 230, and SW1 and SW2 signals are applied from the digital circuits 240 to the analog circuits 230. A LO BATT signal is applied from the supply circuits 235 to the digital circuits 240, while MOT, SOLENOID and DLEN signals are applied from the digital circuits 240 to the supply circuits 235. The DLEN signal is also applied to a display driver 245 for driving the LCD display panel 220. A DISPLAY DATA signal and a V+ signal are also applied from the digital circuits 240 to the display driver 245.

Analog Circuits

The basic function of the analog circuits 230 is to provide an interface between the input leads and the remaining circuitry of the tester 200. It receives the analog input signals from the leads and places them in proper condition for handling by the digital circuits 240. Referring to FIG. 9, the analog circuits 230 include a Hall supply 250 which provides a supply to the Hall chip in the Hall probe 206. The current detected by the Hall probe 206 is applied via the cable 207 to signal conditioning circuitry 251 which converts the signal from a differential to a single-ended signal and adjusts its level. The conditioned current signal is then applied to a test signal switch 252. Also applied to the test signal switch 252 are the EXT VOLTS and BATT VOLTS inputs through voltage dividers 265 and 266, respectively. The test signal switch 252 selects among the three inputs and switches the selected input to the output as VPOS and VNEG signals, which cooperate to form the TEST SIG signal which is applied via the line 267 to the digital circuits 240 (FIG. 11). The selection is controlled by SW1 and SW2 control signals from the digital circuits 240. Essentially, the test signal switch 252 will toggle between an amps input from the Hall probe 206 and a voltage input, the voltage input being either the EXT VOLTS input or the BATT VOLTS input, depending upon which has been selected by the BATTERY/EXTERNAL key. For purposes of the following discussion it will be assumed that the voltage input is the BATT VOLTS input from the battery clamps 208, and that the External Volts terminals 215 are not used. Thus, the test signal switch 252 will alternate its output between the HALL PROBE input (e.g., alternator output current) and the BATT VOLTS input (e.g., battery output voltage).

The current signal from the signal conditioning circuit 251 is also applied through an amplifier 253 to offset compensation circuitry 254 which sums the output of the amplifier 253 with an AMPOFFSET signal from the digital circuits 240. The latter signal corresponds to the current offset reading registered when the ZERO key is pressed, as is described more fully below. The output of the current offset compensation circuitry 254 is then applied to alternator diode test circuitry 255. More specifically, it is applied to an AC component detection circuit 256, for detecting the AC or ripple component of the current signal, and to a low pass filter 257, which has a cutoff frequency of about 2 Hz for passing only the DC component of the signal. The AC component detection circuitry 256 may be of the type disclosed in U.S. Pat. No. 4,459,548, and includes a bandpass filter set to attenuate ignition noise and 60 Hz power line noise, detectors for the peaks and valleys of the AC component and a summer to give the peak-to-peak amplitude of the AC component. The output of the AC component detection circuit 256 is applied to the inverting input terminals of each of two comparators 260 and 261. The DC component at the output of the low pass filter 257 is applied to an absolute value generator 258, the output of which is always positive, and which is fed through a resistor 262 to the non-inverting input of the comparator 260, and then from the resistor 262 through a voltage divider, comprising resistors 263 and 264, to the non-inverting input of the comparator 261. The values of the resistors 262-264 are set so that the input to the non-inverting terminal of the comparator 260 is 0.6 of the DC component and the input to the non-inverting terminal of the comparator 261 is 0.4 of the DC component.

The alternator diode test circuitry 255 is designed to test the ratio of the AC component to the DC component of the current signal from the Hall probe 206, as is explained in greater in detail in the aforementioned U.S. Pat. No. 4,459,548. Thus, it can be seen that, if the AC/DC ratio is greater than 0.6, both of the ALTEST 1 and 2 signals which are, respectively, the outputs of the comparators 260 and 261, will be low, indicating that the alternator diodes are bad. If the AC/DC ratio is less than 0.4, the outputs of both of the comparators 260 and 261 will be high, indicating that the diodes are good. If the AC/DC ratio is greater than 0.4 but less than 0.6, the output of comparator 260 will be high and the output of comparator 261 will be low, indicating that the condition of the diodes is marginal. As was indicated above, the alternator diode display 228 can be toggled on by actuation of the ON/OFF key to indicate whether the diodes are "Good," "Marginal" or "Bad."

The analog circuits 230 also include a power supply 268 which receives the +6.5 V supply voltage from the supply circuits 235, and regulates it to V+ V− supply voltages for the analog circuits.

Digital Circuits

Referring now to FIG. 11, the digital circuits 240 are the control center for the tester 200. They include a microprocessor controller 270 and an associated EPROM 271, a latch 272 and a non-volatile RAM 273, as well as two port expanders 274 and 275, each of which has two 8-bit ports, a 6-bit port and 256 bytes of RAM. The digital circuits 240 also include a fast analog-to-digital converter ("ADC") 276 and a slow ADC 277. The microprocessor 270 has a crystal-controlled master clock frequency of 6 MHz, which is divided by clock dividers 278 into a 1 MHz clock signal for controlling the fast ADC 276 and a 250 KHz clock signal for controlling the slow ADC 277. The microprocessor 270 communicates with the EPROM 271, the latch 272, the RAM 273 and the port expanders 274 and 275 via a multiplex address/data bus 280. The addresses for the EPROM 271 and the RAM 273 are latched in the latch 272 and are communicated to the EPROM 271 and the RAM 273 via an address bus 281 when the bus 280 is carrying data. The digital circuits 240 also include a digital-to-analog converter ("DAC") 282 which feeds a DC offset compensator 283. Digital data is communicated from the ADC's 276 and 277 to the microprocessor 270, and from the microprocessor 270 to the DAC 282 via a data bus 284. The DAC 282 is controlled by DACCS and DACWR signals from the port expander 274.

The keyboard 210 is connected to the digital circuits 240 via keyboard cable 285 and, more specifically, the keyboard cable 285 is connected to the port expander 275 and to a keyboard interrupt circuit 286. While cable 285 has been illustrated connected to the keyboard interrupt circuit 286, actually two of the conductors thereof corresponding, respectively, to the ZERO key and the STOP/RESET key, are not connected to the keyboard interrupt circuit 286. The conductor corresponding to the STOP/RESET key is, however, connected to a power up protect circuit 287 and to the microprocessor 270 for communicating a RESET signal thereto. The power up protect circuit 287 is connected to the RAM 273 and disables it when the STOP/RESET key is pressed or, on power up, until full power is established. The RESET input of the microprocessor 270 is also provided with an RC timing circuit (not shown) which disables the microprocessor 270 on power up until full power is established.

The keyboard interrupt circuit 286 outputs a KEY signal to the microprocessor 270 for indicating that some key (other than the ZERO or STOP/RESET keys) has been actuated, and this actuates a portion of a program software, discussed below, to sample the information in the port expander 275 to determine which key was pressed and initiate the appropriate program routines. The keyboard interrupt circuit 286 includes an RC network with a time constant of 2 seconds. This is because the software is setup to look for a key to be released before returning to the main program from the key interrupt subroutine. In the event that a user presses a key and fails to release it, the RC circuit will generate the KEY signal to the microprocessor 270 at the end of 2 seconds to permit the main program loop to continue, thereby effectively providing "debounce" for the keyboard 210.

The digital circuits 240 also include a rotary decoder 288 which receives the LOADSET signal from the rotary encoder 243 (see FIG. 8) and decodes it. The rotary decoder 288 outputs a ROTDIR signal to the port expander 274, to indicate the direction in which the load set knob 205 was turned, and outputs a ROTCLK signal to the microprocessor 270 to trigger a rotary decoder interrupt in the main program routine, as will be explained more fully below. The rotary encoder 243 is scaled so that one ROTCLK pulse will be generated for each predetermined arc segment of rotation of the load set knob 205. Thus, for example, one complete 360° rotation of the load set knob 205 may generate 40 ROTCLK pulses from the rotary decoder 288. The digital circuits 240 also include a regulator 289 which receives the +6.5 V voltage from the supply circuits 235 and regulates it to a V+ supply voltage for the digital circuits 240, this supply also being provided to the display driver 245 (see FIG. 8).

The microprocessor 270 generates the SW1 and SW2 signals and outputs them through the port expander 274 to the analog circuits 230 for toggling the test signal switch 252 between its current and voltage inputs. The switched output is applied as TEST SIG to the slow ADC 277 of the digital circuits 240. The LOAD-SENSE signal from the feedback shunt resistor 63 of the carbon pile assembly 30 (see FIG. 8) is applied to the fast ADC 276, this signal being representative of the load current through the battery being drawn by the carbon pile assembly 30. Each of the ADC's 276 and 277 is free running, the microprocessor 270 controlling them only when data is to be read therefrom. The ADC's 276 and 277 respectively send FSTAT and SSTAT status signals to the microprocessor 270 via the port expander 274, to indicate when a conversion is complete and data is available. Readout from the ADC's 276 and 277 are respectively controlled by FEN and SEN enable signals which are received from the microprocessor 270 via the port expander 274.

Both of the ADC's 276 and 277 are 12-bit converters. Thus, the 1 MHz clock frequency results in a conversion rate of 120 Hz for the fast ADC 276, while the 250-KHz clock signal results in a conversion rate of 30 Hz for the slow ADC 277. As was indicated above, the slow ADC 277 alternates between taking one current reading from the Hall probe 206, then one voltage (either battery or external, but not both) reading. Once four of each type of reading is taken, the microprocessor 270 averages these readings and updates the displays. More specifically, it outputs, through the port expander 274, the DISPLAY DATA signal and a DLEN enable signal to the display driver 245 (see FIG. 8) to update the LCD display panel 220. The DLEN enable signal is also applied to the supply circuits 235 for a purpose to be explained below. Since the slow ADC 277 is running at a 30 Hz conversion rate and averaging is done after every 8 conversions, it will be appreciated that the displays are updated approximately 4 times per second.

The DC offset compensator 283 allows the analog current signal from the Hall probe 206 (which is used only during an alternator test) to be zeroed when the ZERO key is pressed. In this event, the microprocessor 270 automatically zeros the amps reading it gets from the slow ADC 277 by storing it as an offset value and updating the display accordingly. The microprocessor 270 then sends out a code via the bus 284 to the DAC 282 which is equivalent to the value of the amps signal which was digitally auto-zeroed for the numeric current display 224. This code is converted to an analog signal, and the DC offset compensator circuit 283 then sends it to the analog circuits 230 (FIG. 9) as the AMPOFFSET signal, where it is summed with the signal from the Hall probe 207 in the offset compensation circuit 254, which is used for zeroing the analog signal applied to the alternator diode test circuitry 255 for use in the alternator diode test.

The digital circuits 240 also receive a LOBAT signal from the supply circuits 235, this signal being applied to the microprocessor 270 through the port expander 274 to indicate whether or not the battery voltage is sufficient to safely operate the stepper motor 50 of the carbon pile assembly 30. The ALTEST 1 and 2 signals from the analog circuits 230, which indicate the condition of the alternator diodes, are applied to the microprocessor 270 through the port expander 275. The HOME signal, which indicates that the HOME switch 244 of the carbon pile assembly 30 is closed, is applied to the microprocessor 270 through the port expander 275. The microprocessor 270 also outputs a number of control signals for controlling the operation of the carbon pile assembly 30. More specifically, a SOLENOID signal is output through the port expander 275 to the supply circuits 235 for controlling the solenoid 242 (FIG. 8), and a number of signals are output as a composite MOT signal to the supply circuits 235 for controlling the stepper motor 50. More specifically, these signals include a MOTORHOME signal, which is output through the port expander 275, and DIREC, STEP, HALF/FULL, and ENERGIZE signals, which are output directly from the microprocessor 270.

Supply Circuits

Referring now to FIG. 10, the main functions of the supply circuits 235 are to regulate the battery power to +6.5 V and to drive the stepper motor 50 and the solenoid 242 of the carbon pile assembly 30. The BATT signal, which is the voltage across the carbon pile assembly 30, is applied to a power supply circuit 290, which generates the +6.5 V supply which, in turn, is fed to the analog circuits 230 and the digital circuits 240, as was explained above. The power supply circuit 290 also outputs a $V_{REF}$ signal which corresponds to a battery voltage of about +5.6 V, and is applied to the inverting input of a comparator 291. The BATT voltage is also attenuated in an attenuator 292 and applied to the non-inverting input of the comparator 291 for comparison to the $V_{REF}$ voltage to generate the LOBAT signal, which is applied to the digital circuits 240. If the attenuated battery voltage is greater than +5.6 V, the LOBAT signal will be high to indicate that the battery voltage is sufficient for proper operation of the tester 200, otherwise it will be low to indicate a low battery condition.

The BATT voltage and $V_{REF}$ signal are also applied to a stepper motor control circuit 293, which also receives the composite MOT signal from the digital circuits 240 and translates them into stepper motor phase sequences, which are output as a composite MOTDR drive signal to the stepper motor 50 (see FIG. 8). More specifically, when the DIREC signal is high, the carbon pile load will be increased and when it is low, the load will be decreased. The STEP signal causes the motor 50 to step in the direction indicated by the DIREC signal. When the HALF/FULL signal is high the motor will half step and when it is low the motor will full step. When the MOTORHOME signal goes low, it resets the phase sequence of the motor 50 to its home state. The ENERGIZE signal enables the stepper motor control 293.

The power supply circuit 290 also outputs a V+ supply voltage to a disable circuit 294 which is, in turn, connected to the stepper motor control 293. The disable circuit 294 operates, on power up, to disable the stepper motor control 293 for about two seconds until the power has ramped up to the full power supply, and it does this by effectively shorting the ENERGIZE signal to ground. This helps assure less sparking at the battery clamps 208 when the clamps are initially hooked up to the battery.

The solenoid 242 (FIG. 8) is driven through an AND gate 295 which gates four different logic signals. One input is the V+ supply voltage, which is applied through an RC timing circuit including a resistor 296 and capacitor 297, which disables the solenoid 242 for a brief time during power up to ensure that the supply voltage has completely ramped up to its operating value. The second input to the AND gate 295 is the HOME signal from the home switch 244 of the carbon pile assembly 30 (see FIG. 8). The third input is from a watchdog timer 298, which is reset by the DLEN signal from the digital circuits 240. As was explained above, this signal enables the display driver 245 to update the LCD display 220 approximately four times per second. If a DLEN pulse is not received for about three seconds, the watchdog timer 298 will time out, sending its output low to turn off the solenoid 242. This is a safety feature. In the event the microprocessor 270 were to get lost in its code, the DLEN signal could stop pulsing and the solenoid would then be disabled by the watchdog timer 298 in order to prevent a potentially hazardous situation. The fourth input to the AND gate 295 is the SOLENOID signal from the digital circuits 240, which is the enable signal for the solenoid 242.

When all of its inputs are high, the AND gate 295 will go high to trigger a solenoid driver 299, which also receives the 6.5 V supply voltage from the power supply 290. The solenoid driver 299 will output the SOLDR drive signal to the solenoid 242 for closing the solenoid contacts, thereby connecting the battery to the carbon pile assembly 30 and allowing current to flow therethrough. The drive current through the solenoid 242 is returned to the solenoid driver 299 as the SOLDOUT signal. Thus, it will be appreciated that the SOLENOID signal will engage the solenoid 242 only if the power up time delay has expired, the carbon pile assembly 30 is away from its home position, and the display driver 245 has been pulsed by the DLEN enable signal within the last three seconds.

Operation

The operation of the tester 200 will be described in detail with the aid of the program flow chart illustrated in FIGS. 12A-20E. In this regard, the main program loop 300 is illustrated in FIGS. 12A-12C while FIGS. 13-18, respectively, illustrate the DOAMPS, DOVOLTS, DOAVERAGE, SPEEDY, HOMER, and GOHOME subroutines which are called from other points in the program, FIG. 19 illustrates the ROTARY ENCODER INTERRUPT subroutine and FIGS. 20A-E illustrate the KEYBOARD INTERRUPT subroutine.

A. Power Up-Initialization

On power up, i.e. when the battery clamps 208 are connected to the battery terminals, the power supply circuit 290 in the supply circuits 235 comes into regulation and then the other supplies 268 (FIG. 9) and 289 (FIG. 11) also ramp up. As indicated above, there is a built in power up delay in the microprocessor 270, provided by a suitable RC circuit (not shown) at the RESET input, to prevent the microprocessor 270 from beginning its initialization until the power supplies have had time to come into regulation. Also, as indicated above, the power up protect circuit 287 will maintain the RAM 273 disabled during power up, and the disable circuit 294 will maintain the stepper motor control 293 disabled during power up. These power up protections are to make sure that the full power supply voltages are available before initialization, since otherwise the microprocessor 270 could start to generate spurious output signals. Upon completion of power up, the microprocessor 270 will begin executing its program, stored in the EPROM 271.

Figure 12B:
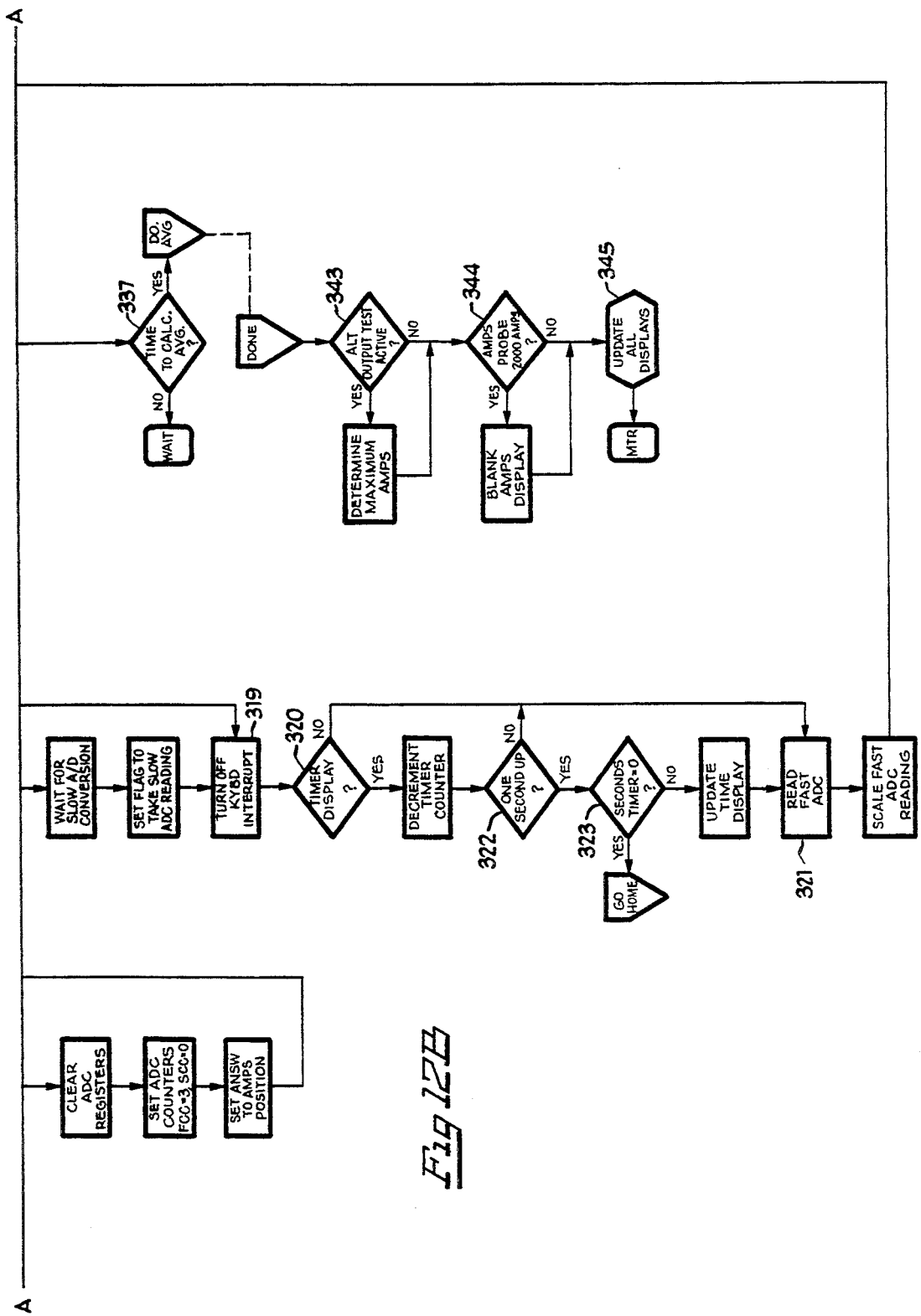

Referring to FIGS. 12A-B, the program will enter the main program loop 300 and the microprocessor 270 will begin initialization, first initializing all its flags and internal registers. In this regard, the flag for the analog test signal switch 252 ("ANSW") will be set to the amps position.

The program then tests all the lamps and calls the HOMER subroutine to position the stepper motor at the home position of the carbon pile assembly 30.

1. HOMER Subroutine

Figure 17:
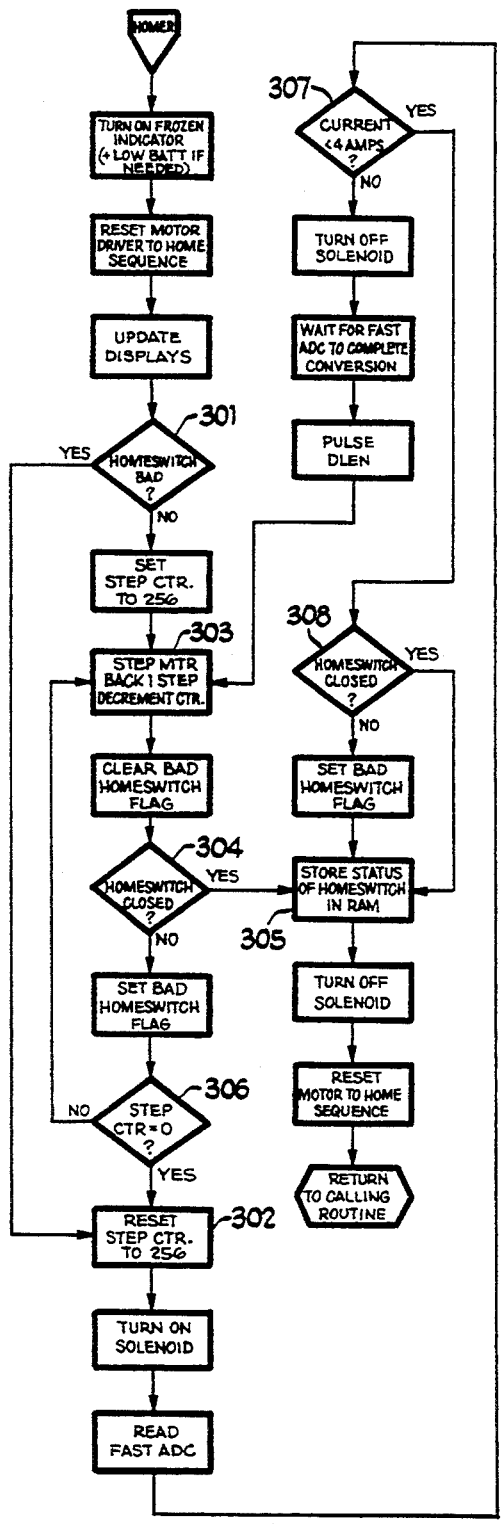

The HOMER subroutine is illustrated in FIG. 17. The subroutine first turns on the "Frozen" display 226 and the "Low Battery" display 227, if needed. Next the stepper motor control 293 is set to its home sequence by the microprocessor 270 outputting the MOTORHOME signal, as explained above. Next the LCD displays are updated and the program checks to see if the home switch 244 is bad at decision 301. It does this by checking the home switch status stored in RAM 273. If the home switch is bad, the program would skip to block 302. If not, the program will proceed from decision 301 to start stepping the carbon pile assembly 30 back to its home position, checking the home switch 244 after each step so it will know when the home position has been searched and, after every 256 steps, will test the home switch to make sure it is functioning properly. More specifically, the program first sets the step counter to 256, and then will decrease the carbon pile load by stepping the motor 50 back one step and decrementing the step counter at block 303. This is effected by the microprocessor 270 outputting the appropriate MOT signals to the stepper motor control 293. The program then clears the bad home switch flag and asks at decision 304 if the home switch is closed, indicating that the carbon pile assembly 30 has returned to its home position. If it has, the program will go directly to block 305, where it stores the home switch status in the RAM 273. The program will then turn off the solenoid by removing the solenoid signal, reset the stepper motor control 293 to its home sequence and return to the calling routine, which, in this case, is the main program loop. If the home switch is not closed at decision 304, the program sets the bad home switch flag and asks at decision 306 if the step counter has decremented to zero. If not, the program returns to block 303 and steps the motor back another step. The program will continue looping in this fashion between blocks 303 and 306 until the step counter reaches zero. Since, at that point, the carbon pile assembly 30 still has not reached its home position, the program proceeds to block 302 and resets the step counter to 256. But before continuing to step the motor, it will first check to make sure the home switch is not bad.

Thus, the program now turns on the solenoid 242 by causing the microprocessor 270 to output the SOLENOID signal. The purpose of this is to connect the carbon pile assembly 30 to the battery to determine if there is any load current flowing. If there is not, then the carbon pile assembly 30 must have reached its home position, and there must be something wrong with the home switch. Accordingly, the program then causes the microprocessor 270 to read the fast ADC 276 to sample the LOAD SENSE signal, which is the battery load current. It does this by outputting an FEN enable signal to the fast ADC 276, assuming that an FSTAT status signal has been received indicating that an ADC conversion has been made. The program then asks that decision 307 if the current is less than 4 amps. If so, this is considered to be a no load condition, and the program will skip to decision 308 to check again if the home switch is closed.

If the current is not less than 4 amps at decision 307, then there is a load on the battery and the carbon pile assembly 30 has not, in fact, returned to its home position. Accordingly, the program will then immediately turn off the solenoid to remove the load from the battery, then wait for the fast ADC 276 to complete its next conversion, as indicated by the FSTAT signal, and then pulses the DLEN signal to reset the watchdog timer 298 for the solenoid, and then returns to block 303 to continue stepping the motor back.

If the current had been less than 4 amps at decision 307 indicating a faulty home switch, the program would proceed to decision 308 to ask if the home switch is closed. If it is, as it should be, the program skips to block 305 and stores the home switch in the ram 273, then proceeds to turn off the solenoid 242 and resets the motor to its home sequence and returns to the calling routine. If, at decision 308, the home switch is not closed, the program sets the bad home switch flag before moving to block 305, so that now a bad home switch flag will be stored in ram 273.

Returning to the main program in FIG. 12A, after the carbon pile assembly 30 has been returned to its home position, the program then blanks all the LCD displays. This completes initialization.

B. Main Loop

The program now proceeds into its main loop at decision 309 to check to see if the battery is low by checking the status of the LOBAT signal from the supply circuits 235. If the battery is low, the program aborts any test in progress by again calling the HOMER subroutine, and then flashes the "Frozen" and "Low Battery" displays 226 and 227, and the program then returns to decision 309. It will continue in this flashing loop until the operator presses the FREEZE/LIVE key to unfreeze the display. The HOMER subroutine is called in this loop because decision 309 can be entered, not only on power up, but also through the block 310 and the carbon pile assembly 30 may have been moved from its home position later in the program.

If, at decision 309, the battery is not low, the program skips to block 311 and turns off the "Low Battery" display 227. It then clears the ADC registers and sets the ADC counters, the fast conversion counter ("FCC") being set to the count of 3 and the slow conversion counter ("SCC") being set to a count of 0. These counters are incremented each time a conversion in the corresponding ADC is made, i.e., in response to the FSTAT and SSTAT SIGNALS. The fast ADC 276 is running four times as fast as the slow ADC 277, so it will make four conversions for every one conversion of the slow ADC 277. The first time through the loop it is desired to take a slow ADC reading immediately, and this can be done only after four fast ADC conversions have been made. Thus, the FCC is set at three so that the first fast conversion will bring it to four and permit a slow ADC reading to be taken. The program then sets the analog test signal switch 252 to the amps position. This is accomplished by the microprocessor 270 outputting the appropriate SW1 and SW2 signals to the test signal switch 252. The switch and its flag are set separately to allow settling time for the switch.

The program then checks decision 312 to see if the auto zero flag is set. This flag is set during initialization. If it is set, the program calls an auto zero subroutine (not shown) to zero the current signal from the Hall probe 206 and then clears the flag and exits that subroutine and proceeds to block 313. Otherwise, the program goes directly from decision 312 to block 313 and waits for a slow ADC conversion, and then to block 314 to wait for a fast ADC conversion, whereupon the program now knows that it has good pieces of data in each of the ADC's 276 and 277.

The program now asks at decision 315 if the "Frozen" flag is set. If so, the program returns directly via point 310 to decision 309 to repeat this portion of the main loop, since it does not need to take any more ADC readings. On power up the "Frozen" flag will not be set, so the program asks at decision 316 if this is the first pass through the program. If it is not, the program turns on the keyboard interrupt but, since this is the first pass the program bypasses the keyboard interrupt so as not to permit the user to interrupt the program by a key actuation during the first loop through the program. Next, at block 317, the FCC is incremented, and the program then checks at decision 318 to see if the FCC is at 4. If not, the program skips to block 319. On the first fast through, the FCC will be at 4 because it was initially set at 3, so the program then waits for a slow ADC conversion and sets a flag to take a slow ADC reading, and then turns off the keyboard interrupt at block 319.

The program then asks at decision 320 if the timer display 222 should be on. It should be if a timed test, such as a battery load test or an alternator test has been selected by the user by actuation of the appropriate one of the START keys 211 or 213. Since this is the first, pass through the program, those keys are inactive, so the timer should not be on and the program skips directly to block 321, where it reads the fast ADC. If a timed test had been selected at decision 320, the program would proceed to decrement the timer counter by one count. The timer counter essentially counts the fast ADC conversions. Since the program can loop through the main loop only about 89 times per second, this timer is set for 89 counts per second. The program then asks at decision 322 if one second has expired. If not, it drops to block 321, and if so it next asks if decision 323 if the seconds timers has reached zero. If not, the program updates the timer display 222, decrementing it one second, and then reads the fast ADC at block 321, scales that reading and then proceeds to decision 324. If, after decision 323, the seconds timer had reached zero, this would mean that a timed test had been completed, and the program would then proceed to the GOHOME subroutine, which will be explained more fully below.

At decision 324, the programs checks to see if the alternator test flag has been set, i.e., whether the alternator test has been selected by the operator actuating the START key 213. If it has, the programs skips to decision 325. On power up, the alternator test cannot have been selected, so the program proceeds to decision 326 to check to see if the battery load current, which was just read from the fast ADC, is less than, greater than or equal to the LOADSET value. The tester 200 is preferably set up with a default LOADSET value of 25 amps, but this can be manually changed by the operator by actuation of the load set knob 205. On power up the LOADSET will be at the default value. If the measured load current reading is equal to the LOADSET the program does nothing and proceeds to decision 325. If it is lower than the LOADSET value by two amps or more, the program increases the load by the microprocessor outputting the appropriate MOT signals to the stepper motor control 293. If the measured load reading is greater than the LOADSET by two amps or more, the program decreases the load by backing off the stepper motor control 293 by one step. As is explained more fully below, on power up the program is looping through its main loop in an idling condition. Thus, while it causes the appropriate MOT signals to be generated, the ENERGIZE one of those signals will be off, so that the stepper motor 50 will not respond, until a battery load test or an alternator test is selected by the operator.

At decision 325, the program checks to see if a slow ADC reading should be taken. Such a reading should be taken every four fast ADC conversions. If it is not time to take a slow ADC reading, the program returns through a delay to the block 314 to wait for the next fast ADC conversion and will continue looping through this portion of the program until four fast ADC conversion readings have been taken. Since this is the first pass through the program, it will be time to take a slow ADC reading, since the FCC was caused by its preset to increment to four on the first pass, as explained above. Thus, the program will take a slow ADC reading, which will be an amps reading since the test signal switch 252 was originally set to the amps position, and then will switch the test signal switch 252 back to the volts position, so that the next time a slow ADC reading is taken it will be a volts reading. Next, the program polls the ZERO key and, if it has been pressed, sets the auto zero flag. This flag will be detected at decision 312 on the next loop through the program. The program then drops to decision 327 to see if the amps or volts flag is set, i.e., whether the flag for test signal switch 252 is in the amps position or the volts position. Since the flag was initially set in the amps position during power up, as indicated above, the program will proceed to call the DOAMPS subroutine.

1. DOAMPS Subroutine

This subroutine subtracts off the auto zero registers from the last slow ADC amps reading and linearizes the reading if it is over 300 amps. It also tests the ALTEST 1 & 2 signals from the alternator diode test circuitry 255 (FIG. 9) if the alternator diode test is active. It updates the bar graph display registers and adds the latest current signal (after the auto zero and linearization) to the current sum registers.

Referring to FIG. 13, the DOAMPS subroutine first checks at decision 328 to see if the battery load test flag is set. This flag is set by the operator pressing the START switch 211. If it is set, the program skips to decision 329. Since it will not be set on the first pass through the loop, the program will proceed to add to the ADC amps registers any auto zero offset which may have been set, and then proceeds to ask at decision 330 if the amps reading is greater than 300 amps. If it is, the program linearizes the amps reading and then proceeds to decision 329 to see if the alternator diode test flag is set. If the amps reading is less than 300 amps, the program skips the linearization step and proceeds directly to decision 329.

If the alternator diode test flag has not been set (by operator actuation of the ON/OFF key), the program will turn off the alternator diode display 228, and will then skip to decision 331. If the alternator diode test flag had been set, the program would first read the alternator diode test inputs, i.e., the ALTEST 1 and 2 signals, and then turn on the appropriate indicator in the alternator diode display 228 before proceeding to decision 331. The program next checks at decision 331 to see if the battery load test flag has been set by the user actuating the START key 211. On start up it will not have been set, so the program will skip to decision 332. If it had been set, the program would first scale the last fast ADC current reading and then load the slow ADC current registers with the data from the fast ADC registers. In other words, in the event that the battery load test has been selected, the program uses the LOAD SENSE current reading from the carbon pile assembly 30 rather than the alternator current reading from the Hall probe 206, and it does this by simply overwriting the slow ADC current registers with the reading from the fast ADC.

The program then proceeds to decision 332 to check to see if the "Frozen" flag has been set by the user toggling the FREEZE/LIVE key. If it is set, the program skips to block 333. It will not be set on the first pass through the program, so it will then update the bar graph display 225 before proceeding to block 333, at which point it will add the latest slow ADC amps reading to the previous amps readings and will store the sum. The program then switches the flag for the test signal switch 252 to the volts position and returns to the main program loop at the AVERAGE block. Thus, the next time it is time to take a slow ADC reading at decision 325 in the main program loop, the reading taken will be a voltage reading because the test signal switch 252 is now in the volts position and, at decision 327, the main loop program will branch to call the DOVOLTS subroutine, since the flag for the test signal switch 252 is also in the volts position.

2. DOVOLTS Subroutine

This subroutine compares the measured battery output voltage to the LOADSET value for the alternator test and then controls the motor to increase or decrease the load to regulate to the LOADSET value. It also checks to see if the battery cables have been removed from the battery and then adds the latest voltage battery reading to the voltage sum registers.

Referring to FIG. 14, the DOVOLTS subroutine first checks at decision 334 to see if the alternator test flag has been set. If not, it skips to decision 335. If the alternator output test has been selected, the program will proceed to decision 336 to compare the volts reading just taken from the slow ADC to the LOADSET value which, in the default condition, is set at 12.4 volts for a 12-volt battery and 6.2 volts for a 6-volt battery. This default setting can be changed by the operator by use of the load set knob 205 once the alternator output test has been initiated, but this is rarely done. If the volts measurement is equal to the LOADSET value, nothing is done and the program drops to decision 335 directly. If the measured voltage reading is greater than the LOADSET value, the program will increase the load by one step of the motor 50, thereby to decrease the battery output voltage and then go to decision 335. If the measured voltage is less than the LOADSET value, the program first checks at decision 337 to see if the carbon pile assembly 30 is already at its home position. If it is not, the program decreases the load by one motor step, thereby increasing the battery output voltage, and proceeds to decision 335. If the carbon pile assembly 30 is already at its home position, the program does not decrease the load, but rather drops directly to decision 335, since if the carbon pile assembly 30 is backed off beyond its home position it risks damage to the assembly.

At decision 335, the program checks to see if the battery clamps 208 have been removed from the battery (e.g. had accidentally fallen off during a test), which would be indicated by the battery voltage having dropped substantially to zero. If so, the program sets the open lead flag and proceeds to block 336 where it adds the latest voltage reading from the slow ADC to the sum of the previous readings and then stores the voltage sum. If the voltage leads have not been removed from the battery, the program proceeds from decision 335 directly to block 335a. After storage of the voltage sum, the program switches the flag for the test signal 252 back to the amps position and then returns to the main program.

The main program loop then drops to decision 337 to see if it is time to calculate an average. An average is calculated after four amps readings and four volts readings have been taken from the slow ADC, i.e., after eight consecutive readings from that converter, since the input to that converter is being toggled back and forth between amps and volts signals by the test signal switch 252. If it is not yet time for an average to be taken, the program returns to block 314 and waits for the next fast ADC conversion. If it is time to calculate an average, the program calls the DOAVERAGE subroutine.

3. DOAVERAGE Subroutine

Figure 15:
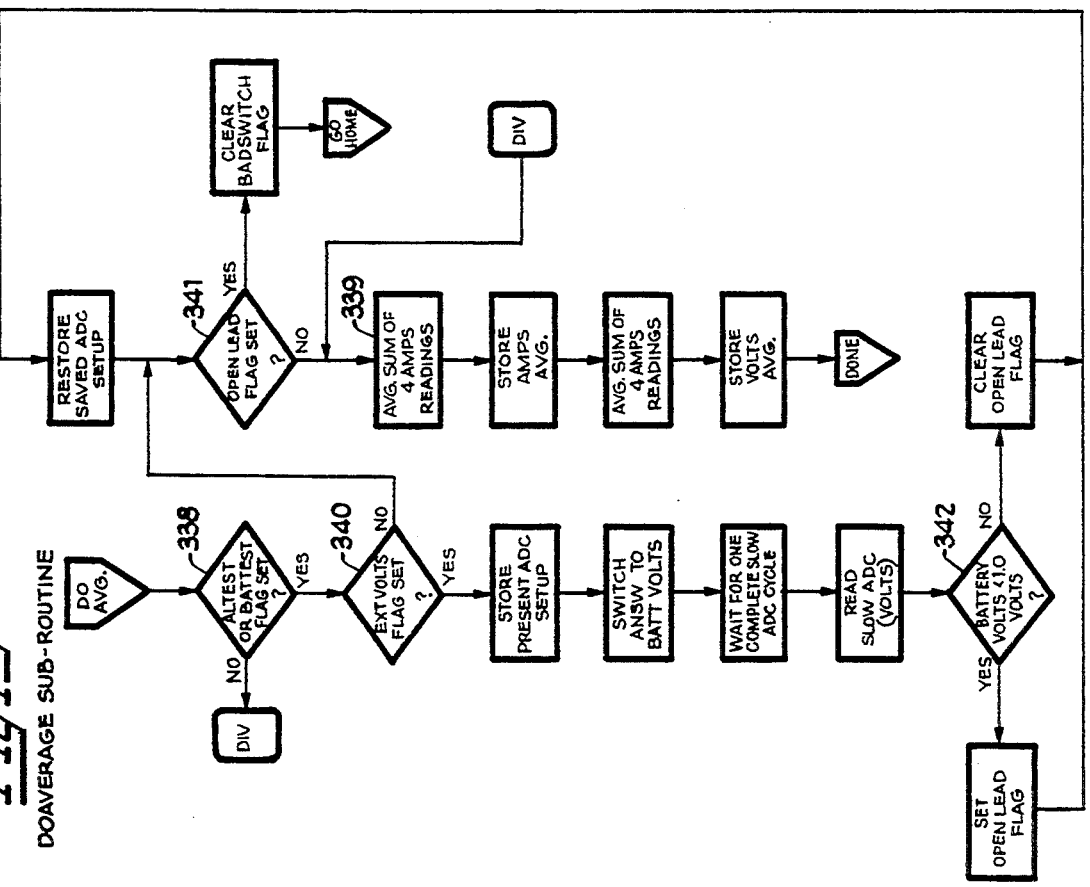

Referring to FIG. 15, the DOAVERAGE subroutine first checks at decision 338 to see if either the alternator test or the battery load test flag has been set. If not, it will proceed directly to block 339 to initiate the averaging functions. If either of the alternator test or the battery load test has been selected, the program asks at decision 340 if the external volts flag has been set by the user toggling the BATTERY/EXTERNAL key. This will be done if the operator wishes to measure an external voltage which is connected to the External Volts Terminals 215, rather than the battery voltage. If this test has not been selected, the program will skip to decision 341, and this will be the normal situation. At decision 341 the program asks if the open lead flag has been set. If it has, the program clears the bad switch flag and then calls the GOHOME subroutine to terminate the test in progress, as will be explained more fully below. If the open lead flag is not set, the program drops to block 339 and averages the sum of the last four current readings from the slow ADC and stores that average and then averages the sum of the last four voltage readings and stores that average, and then returns to the main program loop at the DONE block (FIG. 12B).

In the event that the external volts flag had been set at decision 340, the program would store the present ADC setup and switch the analog test signal switch to the volts position, then wait for one complete cycle of the slow ADC 277 and then check at decision 342 to see if the battery volts reading is less than one volt. If it is, the program will set the open lead flag, and if not, it will clear the open lead flag and, in either case, will then proceed to restore the saved ADC setup and then drop to decision 341. In other words, if the external volts flag is set, the program stores everything momentarily and, before taking its averages, takes a voltage reading to be sure that there is an input connected to the battery cables 209.

Referring again to FIG. 12B, after the averaging process is completed, the main program loop drops to decision 343 to see if the alternator output test is active. An integral part of that test is the termination of the maximum alternator current output during the test, so if the test is active the program will determine the maximum current reading to date, this current reading being obtained from the Hall probe 206 in the case of the alternator output test. More specifically, the microprocessor 270 compares each displayed average current reading with the highest-value previous averaged reading and, if it is greater, stores it. The program then drops to decision 344 to see if the amps reading is above 2000 amps. If it is, the program blanks the current display 224 to indicate an error reading and then drops to block 345 to up date the displays. If the current reading is less than 2000 amps the programs drops directly from decision 344 to block 345. The program then returns at point 310 to begin the main loop again.

In summary, during the main loop of the program, it repeatedly takes readings from the ADC's, taking a reading from the slow ADC 277 after every four readings from the fast ADC 276. The inputs to the slow ADC 277 are alternated between current measurements and voltage measurements, so that the readings therefrom alternate similarly. If a battery load test is selected by the operator, the program will, after each current reading from the slow ADC, override it with the latest value of current from the fast ADC so that battery current rather than Hall probe current is stored. After eight consecutive readings have been taken from the slow ADC the four amps readings and the four volts readings are each averaged and the program then updates the numeric displays in accordance with the average values. This will happen about four times per second.

It will, of course, be understood that the slow ADC 277 will not receive any current input signals unless the operator has clamped the Hall probe 206 to a current-carrying conductor, and this will not be done unless a test, such as the alternator output test, is to be performed. Until a test has actually been selected by the operator, the main program loop simply continues taking readings from the ADC's and updating the displays, but nothing is done to the carbon pile assembly 30. The program will continue sending load increase or load decrease signals to the stepper motor control 293, but nothing will happen since, once initialization is completed and the carbon pile assembly 30 has been returned to its home position, the stepper motor 50 will not again be energized until either a battery load test or an alternator test is selected by the operator. Thus, the main program will continue in this idling condition, waiting for the operator to actuate a key or alter the LOADSET value by actuating the load set knob 205.

When the tester 200 is in its idling condition after power up the LOAD display 221 will display the default 25-amps load, or whatever other load has been preselected by the operator by use of the load set knob 205, as will be explained in greater detail below. The timer display 220 will display the default 15-second time period, the volts display 223 will display the battery voltage as measured by the BATT/VOLTS input to the analog circuits 230 from the battery cable messenger wires, the current display 224 will display zero, the bar graph display 225 will register zero, the "Frozen" display 226 will be off, the "Low Battery" display 227 will be off unless the battery voltage is below 5.6 volts, the alternator diode display 228 will be off and the "Maximum" display will be off.

C. Rotary Encoder Interrupt

Once the tester 200 is powered up, the operator can alter the default LOADSET value by operating the Load set knob 205. He will normally do so if he is planning to conduct a battery load test, since such a test is typically run with the battery loaded to one-half its cold cranking amps rating, which will almost always be greater than the default 25 amps. Rotation of the load set knob 205 will trigger the ROTARY ENCODER INTERRUPT subroutine. More specifically, rotation of the load set knob 205 causes the rotary encoder 243 to send the LOADSET signal to the rotary decoder 288 (FIG. 11), which then outputs a negative-going ROTCLK pulse to the microprocessor 270, and it is this negative going transition which triggers the ROTARY ENCODER INTERRUPT. As indicated above, the rotary decoder 288 will output a series of ROTCLK pulses, the number depending on the degree of rotation of the load set knob 205.

Referring to FIG. 19, this interrupt subroutine first turns off the master interrupt control so that no other interrupts can occur. The routine then checks to see if either the "Frozen" condition or the starter draw test is active at decision 346. If so, there is no need to update the LOADSET value, so the program will skip to block 346a to wait for the ROTCLK pulse to go back high, whereupon the program will reenable the master interrupt control and exit the interrupt subroutine. If the answer at decision 346 is NO, the program next determines at decision 347 if the alternator test flag has been set since, if it is, the LOADSET value must be measured in volts rather than amps. In that case, the program proceeds to decision 348 to determine whether the load volts should be increased or decreased, which will be determined by the condition of the ROTDIR signal from the rotary decoder 288 (FIG. 11).

The program has been set up with battery voltage limits beyond which the test will not be permitted to proceed. More specifically, an upper limit of approximately 18 volts (17.92 volts) is set because a higher voltage may damage the motor, and a lower limit of 4 volts is set, since loading the battery below that voltage could cause damage to the battery. Accordingly, if the operator has called for an increase in load volts (by decreasing the load on the battery), the program will check at decision 349 to see if the battery output voltage is already at 17.92 volts and, if so, it will not permit it to go any higher and will abort to block 346a and exit the subroutine. If the upper limit has not yet been reached, the program will cause the carbon pile assembly 30 to back off sufficiently to add 0.03 volts to the load voltage, and then will drop to block 350 to store the new LOADSET value. If, at decision 348, a decrease in battery voltage is called for, the program checks at decision 351 to see if the minimum voltage of 4 volts has already been reached and, if so, skips to block 346a and exits the subroutine. Otherwise, the program will cause the carbon pile assembly 30 to increase the load on the battery sufficiently to subtract 0.03 volts from the battery voltage and then drop to block 350 to store the new LOADSET value.

If, at decision 347, the alternator test flag is not set, then the program will assume that the LOADSET value is being changed for a battery load test and will change the setting in amps. At decision 352, it asks whether the LOADSET value is to be increased or decreased. If it is to be decreased, the program checks at decision 353 to see if it is already less than 26 amps. If it is, the program skips to block 346a, since it will not display less than the default LOADSET value of 25 amps. The program sets up different counting rates for different ranges of LOADSET values, counting faster for higher ranges to minimize the time it takes to adjust the LOADSET value, while still maintaining the same approximate percentage rate of precision. Thus, 3 ranges have been set, viz., 25–50 amps, 50–100 amps and 100 amps and above. Accordingly, the program next checks the range of the current LOADSET reading at decision 354. If it is less than 51 amps, it subtracts one amp from the LOADSET value, if it is between 50–100 it subtracts 2 amps, and if it is greater than 99 it subtracts 5 amps, and then returns to block 350 to store the new LOADSET value.

The program also sets an upper current LOADSET limit of 600 amps, since no test would be conducted at a load higher than that. Accordingly, if decision 352 had called for an increase in the LOADSET, the program would first check at decision 355 to see if the value was already at 600 amps. If so, it would abort to block 346a. If not, the program then again checks the LOADSET range at decision 356, and will add one amp, two amps or five amps to the LOADSET value, depending upon the range, and it will also set the +600 flag if necessary (i.e., if the increase has brought the LOADSET value up to 600 amps), and then drops to block 350 to store the new LOADSET value. The program then updates the load display 221 and proceeds to block 346a to exit the subroutine, as explained above.

Presumably, the rotation of the load set knob 205 will cause the rotary decoder 288 to generate more than one ROTCLK pulse. As soon as the next ROTCLK pulse arrives, the ROTARY ENCODER INTERRUPT subroutine is again entered and this will continue until the LOADSET value set has been adjusted to correspond to the degree of rotation of the load set knob 205 by the operator, which will occur in a fraction of a second. Thus, as far as the operator is concerned, the load display 221 will change almost instantaneously to follow his rotation of the load set knob 205.

D. Keyboard Interrupt

As was explained above, the keyboard interrupt circuit 286 will be activated when the operator presses any key other than the ZERO or STOP/RESET key, to generate the KEY signal to the microprocessor 270, for triggering the KEYBOARD INTERRUPT subroutine. The ZERO key is repeatedly polled in the main program loop (FIG. 12A). Actuation of the STOP/RESET key causes a RESET signal to be applied directly to the microprocessor 270 for resetting it and causing it to reenter the main program loop at the beginning to reinitialize, just as on power up.

Depression of any other key will trigger the KEYBOARD INTERRUPT subroutine, which is illustrated in FIGS. 20A–D. This subroutine first disables the keyboard and rotary encoder interrupts and then reads the keyboard port on the port expander 275, and then goes through a series of decisions to determine which key was pressed, taking different actions, depending upon which key was actuated. At decision 357, it first checks to see if the FREEZE/LIVE key was pressed. If so, it switches the "Frozen" flag, since this toggles between the frozen and live conditions of the LCD display panel 220. The program then clears the test flags and asks at decision 358 if the "Frozen" flag is set. If so, this means the operator has elected to freeze the display and abort any test in progress. Thus, the program will then call the HOMER subroutine to return the carbon pile assembly 30 to its home position and then jump to block 359 to wait for the KEY signal to go back high, which occurs when the operator releases the key or after the two-second debounce time delay of the keyboard interrupt circuit 286 (FIG. 11), whichever occurs first, and then exits the interrupt subroutine.

If, at decision 358, the "Frozen" flag was not set, meaning the operator had toggled from the freeze condition back to the live condition, the program jumps to block FR4, disables the rotary interrupt, turns off the "Frozen" indicator register, resets the timer register and display register to the default 15 seconds, and asks at decision 360 if the last test was a battery load test. If it was not, the program then resets the load set registers and display 221 to the default 25-amps load setting and, at block 361, updates the load display 221. If the last test was a battery load test, then the program leaves the load set register where it was and proceeds immediately to block 361 to update the load display 221 and then jumps to block 359 to exit the interrupt.

If the FREEZE/LIVE key has not been pressed, the program drops from decision 357 to decision 362 to see if the "Frozen" flag is set from an earlier actuation of the FREEZE/LIVE key. If so, the program will not recognize any other key actuation and will immediately turn on the master interrupt and the keyboard interrupt and exit the interrupt subroutine. If the "Frozen" flag was not set, the program checks at decision 363 to see if the START key 213 for the alternator test was pressed. If so, if jumps to the ALTEST block (FIG. 20C), and checks at decision 364 to see if the alternator test flag is already set, i.e., if this test had already been previously selected. If so, the program will ignore this latest key actuation and proceed immediately to block 359 to exit the interrupt. If not, the program next checks at decision 365 to see if either the ENERGIZE signal has been sent to the stepper motor control 293, or the starter draw test flag is set. If so, this means that the program is already in the middle of some other test and it will again immediately exit the interrupt. Otherwise, it will proceed to decision 366 to see if the timer is at zero. In this case, the program will flash the timer display 222 and exit the interrupt, since there is no time to run the alternator test.

If the timer is not at zero, the program stores the current ADC, analog switch and DAC setups, sets the analog test signal switch 252 to the battery volts position, so that the next conversion of the slow ADC 277 will be a voltage reading, waits for that conversion to occur and then reads that reading from the slow ADC, and checks to see if it is greater than 7.68 volts at decision 367. If it is not, the program will assume that it is a 6-volt battery which is being tested, and will set the 6-volt flag and drop to decision 368. If it is greater than 7.68 volts, it is assumed that a 12-volt battery is being tested, so the 6-volt flag will be cleared before proceeding to decision 368. At decision 368, the program asks if the battery voltage is less than 17.92 volts. If not, the voltage is too high, so the program sets the +18 volt flag, otherwise it clears that flag and then proceeds to decision 369 to see if the voltage is less than 1 volt. If so, this indicates that the battery cables are disconnected and the open lead flag is set, otherwise the program clears the open lead flag and then restores the saved analog switch, ADC and DAC set ups and checks at decision 370 to see if either the open lead or the +18 volt flag is set. If so, the program will flash the volts display 223 to call the operator's attention to the fact that the voltage is too high or that there is an open lead, and will then exit the interrupt. Otherwise, the program will set the alternator test flag and clear the external volts flag, to indicate to the microprocessor 270 that the voltage readings are to be taken from the BATT VOLTS input rather than the EXT VOLTS input of the test signal switch 252, so that the microprocessor 270 can send the appropriate SW1 and SW2 switching signals. The program then sets the register for the load display 221 at the default 12.4 load volts and then checks at decision 371 to see if the 6-volt flag is set and will then either reset the display registers for 6.2 volts or not, depending on the answer, and then calls the SPEEDY subroutine to rapidly move the carbon pile assembly 30 to a position for loading the battery at a minimum default load of 25 amps.

1. SPEEDY Subroutine

Figure 16:
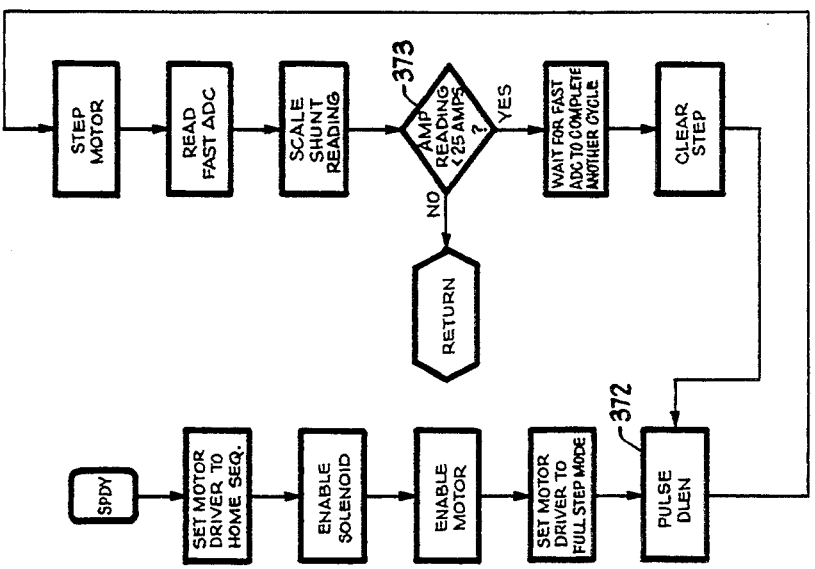

The SPEEDY subroutine, which is illustrated in FIG. 16, sets the carbon pile assembly 30 at the default 25-amps load as fast as possible. It first sets the motor control 293 to the home sequence of the stepper motor by sending the MOTORHOME signal, then enables the solenoid by sending the SOLENOID signal, enables the motor control 293 by sending the ENERGIZE signal, and sets the motor control. 293 to its full step mode by sending the appropriate HALF/FULL signal. In this regard, the program is set so that the motor will full step until a load of 256 amps is reached, at which point it will begin to half step. The program then pulses the DLEN enable signal at block 372 to reset the watchdog timer 298 (FIG. 10), then sends a STEP signal to the motor control 293 to step the motor 50 one step from its home position. The program then reads the fast ADC 276, scales that reading and checks at decision 373 to see if the amps reading is less than 25 amps. If not, the program returns to the KEYBOARD interrupt subroutine, otherwise, the program waits for the fast ADC 276 to complete another cycle, clears the STEP signal to the motor control 293, and returns to block 372 to again pulse the DLEN enable signal. The subroutine will continue in this loop, stepping the motor at the fast ADC conversion rate of 120 Hz, until the load amps reading reaches 25 amps.

After executing the SPEEDY subroutine, the KEYBOARD interrupt subroutine jumps to the Time Set block (FIG. 20A) and then sets the fast ADC counter at 89 which, as indicated above, corresponds to one second, and then sets the register for the load display 221 with the current LOADSET value, updates the timer display 222 and exits the interrupt.

If the alternator test had not been selected at decision 363 (FIG. 20A), the interrupt program would next check at decision 374 to see if the ON/OFF key had been pressed, indicating that the operator had toggled the alternator diode test display 228 on or off. If so, the program switches the display and then exits the subroutine. Otherwise, the program drops to decision 374a to see if the BATTERY/EXTERNAL key was pressed to toggle the volts input. If so, it switches the Battery or External volts flag and switches the volts display 273 between "Battery" and "External." If the BATTERY/EXTERNAL key was not pressed at decision 374a the program proceeds to decision 375 to see if the up arrow key was pressed, indicating that the operator is incrementing the timer. The program is set to increment or decrement the timer five seconds at a time each time that an arrow key is pressed. Also, the program will not permit the timer to exceed 30 seconds, to discourage loading the battery for too long a time. Accordingly, when the up arrow key is pressed, the program will first check at decision 376 to see if the timer is less than 26 seconds. If it is not, it will immediately exit the subroutine, since another 5-second addition will take it beyond 30 seconds. Otherwise, it will add five seconds to the timer register and then move to the Time Set block and proceed as described above.

If the up arrow key was not pressed at decision 375, the program drops to decision 377 to see if the down arrow key was pressed. If so, the program will check at decision 378 to see if the timer is less than 5 seconds. If so, it will immediately exit the interrupt, since another five-second decrease will take it below zero. Otherwise, the program will subtract five second from the timer register and then jump to the Time Set block and proceed as described above.

If the down arrow key was not pressed at decision 377, the program moves to decision 379 to see if the START key 212 was pressed to initiate the starter current draw test. If so, the program proceeds to decision 380 to see if any other test is active and, if it is, the key depression is not recognized and the KEYBOARD INTERRUPT subroutine is immediately exited. Otherwise, the program next checks at decision 381 to see if the timer is at zero. If so, it flashes the timer display and exits the interrupt, otherwise it proceeds to disable the rotary interrupt, clear the ENERGIZE signal to disable the motor and change the LOADSET value set to zero amps so that the carbon pile assembly 30 will not be loading the battery during the starter draw test. The program then jumps to the Time Set block as described above.

If the START key 212 was not pressed at decision 379, the program checks at decision 382 to see if the START key 211 was pressed to initiate the battery load test. If not, the interrupt is exited, since all keys have been checked. If the battery load test was selected the program jumps to the Load Set block (FIG. 20C) and checks at decision 383 to see if the starter draw test is active and, if not, drops to decision 384 to see if the motor is energized, indicating that an alternator test or a battery load test is already in progress. In any of these cases the interrupt will be exited immediately, otherwise the program next stores the current setup of the test signal switch 252 and the ADC's and DAC, sets the test signal switch 252 to the BATT/VOLTS input, waits for one complete cycle of the slow ADC 277 and then reads that ADC. The program then checks at decisions 385 and 386 to see if there is an open battery lead or if the battery voltage is in excess of 17.92 volts, and clears or sets the appropriate flags in the same manner as was described above in connection with the ALT-EST branch of the KEYBOARD INTERRUPT subroutine. Next, the program restores the saved setup of the test signal switch 252 and the ADC's and DAC and checks at decision 387 to see if the open lead flag is set. If so, it flashes the volts display 223 to indicate that condition and exits the interrupt, otherwise it checks at decision 388 to see if the timer is at zero. If so, it flashes the timer display 222 and exits the interrupt, otherwise it sets the battery load test flag, executes the speedy subroutine (FIG. 16), described above, to rapidly load the battery to 25 amps then jumps to the Time Set block (FIG. 20A) and proceeds to exit the interrupt, as described above.

E. Battery Load Test

After the tester 200 is powered up, the operator will typically reset the LOADSET value at a higher amps value than the default 25 amps, before initiating the battery load test. This is accomplished by rotating the load set knob 205, which initiates the rotary encoder INTERRUPT subroutine, described above in connection with FIG. 19, until the desired LOADSET current value appears in the load display 221. The program of the tester 200 will otherwise be in its idling condition, looping through the main program loop (FIGS. 12A-B). The operator next checks to make sure that the "Battery" volts is displayed on the volts and, if not, toggles the BATTERY/EXTERNAL key to bring up the proper display. The operator then initiates the battery load test by pressing the START key 211.

As soon as this key is pressed, the program will enter the KEYBOARD INTERRUPT subroutine, described above in connection with FIGS. 20A-D, and will proceed down the Load Set branch of that subroutine. In this branch, the program will immediately operate the carbon pile assembly 30 to load the battery to the 25-amp default load setting by executing the SPEEDY subroutine, described above in connection with FIG. 16. This happens in a fraction of a second, and then the program returns from the KEYBOARD INTERRUPT subroutine to the main program loop, increasing the load by one step of the stepper motor 50 each time through the main loop, at the rate of approximately 89 steps per second, until the battery load current, as measured by the LOAD SENSE signal from the feedback resister 63 (FIG. 8), is within 2 amps of the LOADSET current value displayed in the load display 221, as preset by the operator. This will happen within a second or two, so the operator will see the current display 224 flash a couple different values before it settles in at about the LOADSET value. The main program loop will maintain this load current within two amps of the LOADSET value, thereby effectively regulating the battery load current to the LOADSET value. It will be appreciated that, since a battery load test was selected, the current readings in the current display 224 are those measured in the LOAD SENSE signal from the feedback resistor 63, since the Hall probe 206 is not being used. As was explained above, the main program loop accounts for this since, each time it takes a current reading from the slow ADC 277, it execute the DOAMPS subroutine, and this subroutine recognizes that a battery load test is in progress and, therefore, overwrites the slow ADC current register with the last current reading from the fast ADC 276, i.e., the shunt reading from the feedback resistor 63. Thus, when the main program loop executes the DOAVERAGE subroutine, it is LOAD SENSE current readings from the feedback resistor 63 which are being averaged when a battery load test is in progress. This will all happen automatically, so that the operator need not concern himself with the load being applied by the carbon pile assembly 30, and does not have to touch anything during the test. As the battery is loaded, its output voltage, as indicated in the volts display 223, will vary, and the operator will monitor this display to be sure that the battery voltage stays above a prescribed minimum voltage, which will vary somewhat with the ambient temperature. If the battery voltage does not drop below this prescribed minimum during the test, then the battery capacity is adequate.

As the program proceeds through the main loop, it will decrement the timer display 222 each second, so that the number of seconds left in the test will always be visible to the operator. This time can be manually incremented or decremented at any time by the operator by the use of the arrow keys. Thus, for example, if the timer has timed down to five seconds and the operator wants to extend the test, he can add another five seconds to the test each time he presses the up arrow key. When the timer reaches zero the test is over and the main program loop will call the GOHOME subroutine, as indicated in FIG. 12B. Essentially, this subroutine flashes the "Frozen" display 226, freezes the other displays and removes the load from the battery.

1. GOHOME Subroutine

Figure 18:
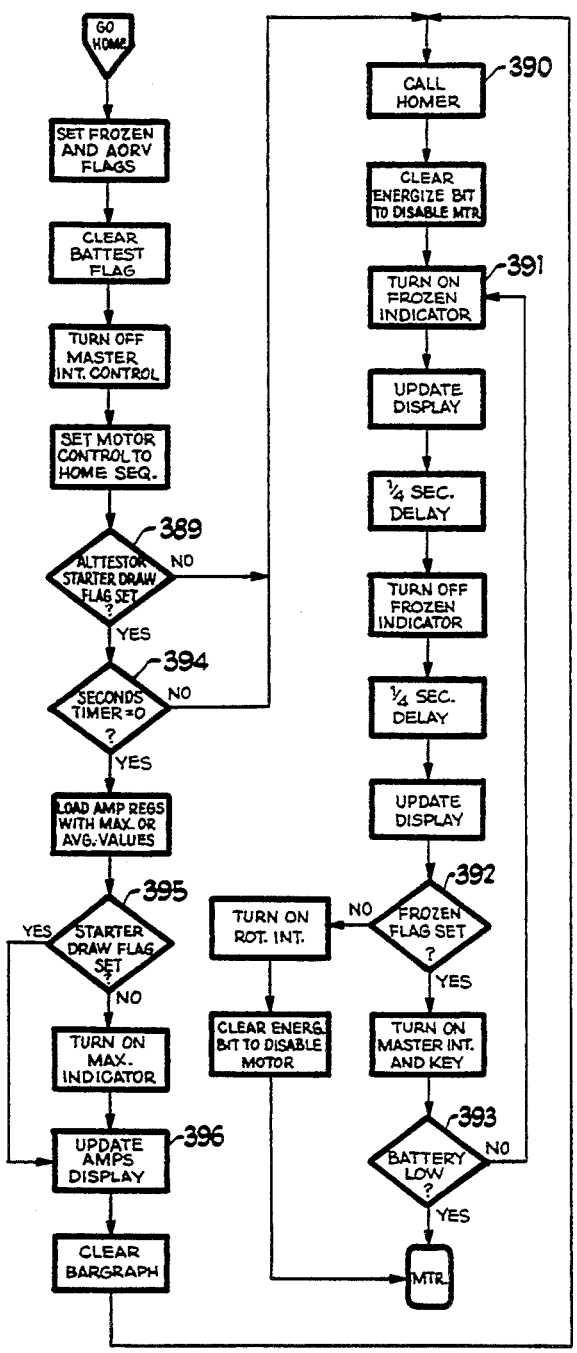
Figure 19:
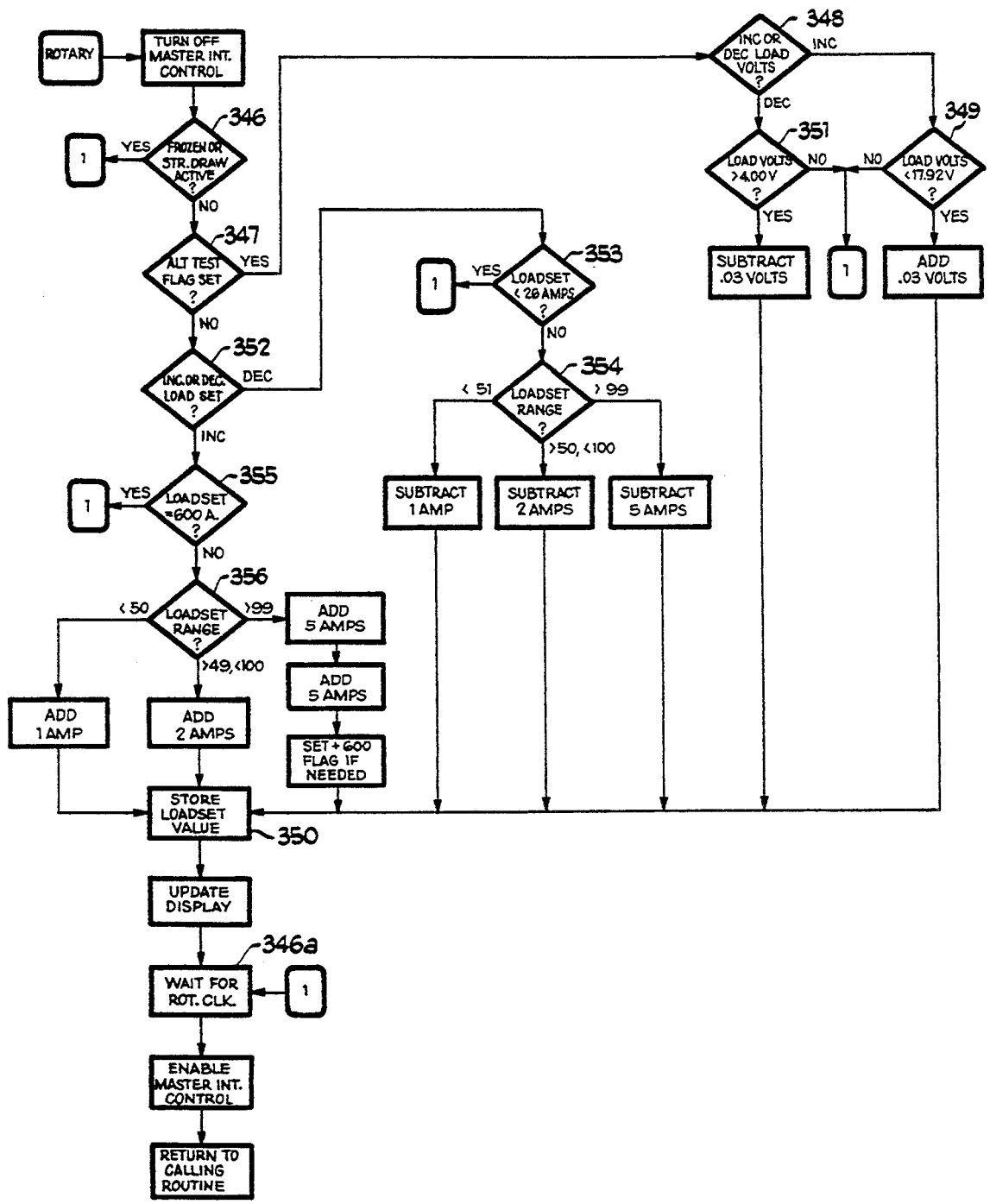

More specifically, referring to FIG. 18, the GOHOME subroutine first sets the "Frozen" and amps or volts flags, clears the battery load test flag, turns off the master interrupt control, resets the motor control to its home sequence by sending the MOTORHOME signal and then, at decision 389, checks to see if the alternator test or starter draw test flags are set, since those are also timed tests through which this subroutine could have been entered. If either of those tests is in progress, then something must be done to the displays before they are frozen. In this instance the program has just finished the battery load test, so it moves immediately to block 390, where it calls the HOMER subroutine to relieve the load from the battery by moving the carbon pile assembly 30 back to its home position, as was explained above in connection with FIG. 17. The program then clears the ENERGIZE signal to disable the motor, and turns on the "Frozen" display 226 at block 391. The program then updates the display and, after a ¼-second delay, turns off the "Frozen" display 226 and then, after another ¼-second delay again updates the display. The subroutine then asks at decision 392 if the "Frozen" flag is still set. It is, because it was set when the program entered this subroutine. Accordingly, the program then turns on the master interrupt and key interrupt and checks at decision 393 to see if the battery voltage is low by checking the state of the LOBAT signal from the supply circuits 235 (see FIGS. 10 and 11). If it is, the subroutine will be exited and the program will return to the main program loop at block 310 (FIG. 12A), which will flash the "Frozen" and "Low Battery" displays 226 and 227, as was explained above. If the battery is not low, the GOHOME subroutine will return to block 391 and repeat the loop between block 391 and decision 393, which loop effects a flashing of the "Frozen" display 226 by means of the ¼-second delays. The subroutine will continue in this loop until the operator presses the "FREEZE/LIVE" key. When he does, then when the subroutine reaches decision 392 the "Frozen" flag will not be set, so the program will then turn on the rotary interrupt and clear the ENERGIZE signal to disable the motor and then return to the main program loop at block 310 (FIG. 12A). In other words, the GOHOME subroutine unloads the battery by flashing the "Frozen" display 226 and freezes the other displays, and stays in this flashing mode until the FREEZE/LIVE key is pressed or until the battery goes low.

If the battery voltage had dropped below the prescribed minimum value during the battery load test, this could indicate that the battery capacity was inadequate, or it could have resulted from the battery being insufficiently charged at the beginning of the test. The charge should have been checked by the operator by testing the open-circuit voltage before the battery load test was started, but in case he did not do so, he can monitor the battery voltage for the next five to ten minutes. If the battery voltage recovers to 12.4 volts or more, then this indicates that the battery does not have the required capacity and should be replaced. If it does not recover, the battery should be charged and the battery load test repeated. If the battery fails the load test on the second attempt, the battery capacity is insufficient and it should be replaced.

F. Alternator Test

Before beginning this test, the operator should first check to see that the volts display 2223 is indicating "Battery" volts rather than "External" volts and, if not, he should toggle the BATTERY/EXTERNAL key to bring up the correct display. In order to perform the alternator test, the operator must first connect the Hall probe 206 by clamping it around the alternator output cable 155 (see FIGS. 6 and 7). This will provide the Hall probe current input to the analog circuits 230 (FIG. 9). The operator should check to see that the alternator diode display 228 is on and, if not, turn it on by toggling the ON/OFF switch. He should then check to see if there is any significant current reading on the current display 224 and then "zero" the current display, if necessary, by pressing the ZERO key. This will cause the microprocessor 270 to store the current value for use in offset compensation, as was described above. The operator should then start the vehicle engine and increase its speed to the rpm prescribed by the manufacturer to ensure that the alternator 154 is capable producing its maximum output.

The alternator test is initiated from the idle condition of the tester 200 by the operator pressing the START key 213. This will trigger the KEYBOARD INTERRUPT subroutine, which will proceed into its ALTEST branch, (FIG. 20C-D). This will cause the load display 221 to switch to volts, and it will display the default reading of 12.4 volts, assuming that the charging system 150 which is being tested includes a 12-volt battery. The LOADSET voltage reading cannot be preset by the operator to some value other than the default value because the load display 221 will not switch from amps to volts until after the alternator test is initiated. Once the test is initiated, the operator can alter the LOADSET reading by manipulation by the load set knob 205, and he may wish to do so if he suspects that the alternator 154 is not reaching its maximum current output at the default 12.4-volt load.

The timer display 222 will again start out at its default 15-second time period and will time down to zero during the test, although this time can again be manually incremented or decremented by the operator by use of the arrow keys, in the same manner as was described above in connection with the battery load test. When the test is initiated, the ALTEST branch of the KEYBOARD INTERRUPT subroutine will immediately drive the carbon pile assembly 30 to load the battery to the default 25-amp load by means of the SPEEDY subroutine, in the same manner as was described above for the battery load test, and then return the program to the main loop. Each time the main loop of the program takes a voltage reading from the slow ADC 277, it will execute the DOVOLTS subroutine, in which it will compare the battery volts reading with the LOADSET value and increase or decrease the load as necessary to regulate the battery output voltage to the LOADSET value, as was explained above in connection with FIG. 14. Thus, the tester 200 will automatically maintain the battery voltage substantially at the LOADSET values throughout the alternator test.

The operator will have to maintain the engine speed during the entire test. Therefore, it is a significant aspect of the present invention that, once the test is started, he does not have to touch anything on the tester 200, nor does he have to monitor any of the displays. The tester 200 will automatically adjust the load placed on the battery by the carbon pile assembly 30 to regulate the battery output voltage to the LOADSET value of 12.4 volts. The program will also automatically capture the maximum current reading and detect it and display it in the current display 224 during the test and display it at the end of the test. Thus, as was described above, each time the program passes through the main loop it will determine the maximum amps reading to date and, when the timer times out, the program will execute the GOHOME subroutine, which will cause the maximum value detected to be displayed in the current display 224 and will turn on the "Maximum" display 229. More specifically, referring to FIG. 18, when the GOHOME subroutine reaches decision 389, the alternator test flag will have been set, so the program will proceed to decision 394 to see if the seconds timer is at zero. It does this because this subroutine could also have been entered from the DOAVERAGE subroutine in the event of an open lead condition, as was explained above in connection with FIG. 15. If the timer were not zero, the program would move immediately to block 390. In this case, the timer is at zero, so this subroutine must have been entered through timeout of either the alternator test or the starter draw test, so the program then loads the amps registers with maximum and average values and then checks at decision 395 to see whether it was the alternator test or the starter draw test which was just concluded. If it was the starter draw test, the program would immediately update the current displays at block 396. Since it was the alternator test, the program first turns on the "Maximum" display 229 before updating the amps displays and, in this case, the amps display 224 will be updated with the maximum current value which was read during the test. The program will then clear the bar graph display 225 and move to block 390 and will then continue as was described above.

If the maximum current reading is within 10% of the rated amperage of the alternator 154, it is considered to be good. If not, then further troubleshooting is required to determine if the alternator is faulty. The alternator diode test display 228 will indicate whether the diodes are "Good", "Marginal", or "Bad" in accordance with the ALTEST 1 & 2 signals, as described above.

At any time, the operator can abort a test by pressing the FREEZE/LIVE key or the STOP/RESET key. The former will freeze the displays and remove the load from the battery. If the display is frozen, in the case of a battery load test or an alternator test when the FREEZE/LIVE key is again pressed to return to a live condition, the display will return to its default or idle condition. However, it will continue to show the alternator diode display 228 if it had been turned on, and in the event of a starter draw test or a battery load test, those conditions would continue to be monitored. The STOP/RESET button, on the other hand, will completely reset the microprocessor 270 and return it to its initializing routine.

In a constructional model of the invention, the test signal switch 252 may be a 4052B made by Motorola, the microprocessor 270 may be an INTEL 80C31, the EPROM may be a National Semiconductor 27C64, the RAM may be an S. G. S. Thomson 48Z02, the port expanders 274 and 275 may be INTEL 8155's, the ADC's 276 and 277 may be Harris Corporation 7109's, the clock divider 278 may include Motorola 74LS92 and National Semiconductor 4018B counters and the DAC 282 may be a National Semiconductor 0832.

From the foregoing, it can be seen that there has been provided an improved battery and charging system tester which effects automatic control of a carbon pile load to provide hands-off battery load and charging system tests by automatically regulating the battery load current or output voltage, as the case may be, to preset reference values, while at the same time capturing and displaying the maximum current output of the charging system during a charging system test.

We claim:

1. Apparatus for testing the current output of a battery charging system comprising:
    a carbon pile electrical impedance adapted to be connected to the battery for loading thereof;
    compression means coupled to said carbon pile impedance for varying the compression thereof and thereby effecting variation of the impedance thereof, said compression means, including a rotatable shaft, and clamping means threadedly engaged with said shaft and adapted for engagement with the carbon pile; a motor coupled to said compression means for driving same, said motor being coupled to said shaft for rotating same, thereby to move said clamping means relative to the carbon pile for varying the compression thereof;
    a current sensor adapted to be coupled to the charging system for detecting the current, output thereof;
    a voltage sensor adapted to be coupled to the battery for detecting the output voltage thereof;
    a feedback control circuit coupled to said motive means and to said voltage sensing means and responsive to the battery output voltage for controlling said motive means to vary said impedance so as to regulate the battery output voltage to a predetermined value; and
    display means coupled to said current sensor for monitoring the current output of the battery charging system while the battery is being loaded.

2. The apparatus of claim 1, wherein said current sensor includes a Hall probe.

3. The apparatus of claim 1, and further comprising a timer coupled to said feedback control circuit for controlling the time period during which the battery output voltage is regulated to said predetermined value, said timer including manually operable adjustment means for selectively adjusting the time period during which the battery output voltage is regulated to said predetermined value.

4. The apparatus of claim 1, wherein said display means includes means for displaying said predetermined value.

5. The apparatus of claim 4, and further comprising means for selectively varying said predetermined value.

6. The apparatus of claim 1, wherein said feedback control circuit includes a peak capture circuit for capturing the maximum current output value of the current charging system while the battery is being loaded and causing said display means to display that maximum value.

7. Apparatus for automatically loading a battery for testing thereof, comprising:
    carbon pile electrical impedance adapted to be connected in series with the battery for loading thereof, compression means coupled to said impedance for varying the compression thereof and thereby effecting variation of the impedance thereof, said compression means including a rotatable shaft, and clamping means threadedly engaged with said shaft and adapted for engagement with the carbon pile, a motor coupled to said compression means for driving same, said motor being coupled to said shaft for rotating same thereby to move said clamping means relative to the carbon pile for varying the compression thereof;

a feedback circuit coupled to said impedance for generating a feedback signal proportional to the load current through said impedance, a drive controller coupled to said motor and to said feedback circuit and responsive to said feedback signal for automatically controlling the operation of said motor to regulate the load current through said impedance to a predetermined value, and a timer coupled to said drive controller for selectively adjusting the time period during which said predetermined load current is maintained.

8. The apparatus of claim 7, wherein said drive controller includes a comparator for comparing said feedback signal with a reference signal corresponding to said predetermined value.

9. The apparatus of claim 8, and further comprising means for selectively varying said predetermined value.

10. The apparatus of claim 9, and further comprising a display for displaying said predetermined value.

11. The apparatus of claim 7, and further comprising a display for displaying the value of the load current.

12. The apparatus of claim 7, wherein said drive controller includes means for varying the rate at which said compression means is operated.

* * * * *